(12) United States Patent
Rasmussen et al.

(10) Patent No.: US 7,596,476 B2
(45) Date of Patent: Sep. 29, 2009

(54) METHODS AND SYSTEMS FOR MANAGING FACILITY POWER AND COOLING

(75) Inventors: Neil Rasmussen, Concord, MA (US); James W. VanGilder, Pepperell, MA (US)

(73) Assignee: American Power Conversion Corporation, West Kingston, RI (US)

( * ) Notice: Subject to any disclaimer, the term of this patent is extended or adjusted under 35 U.S.C. 154(b) by 408 days.

(21) Appl. No.: 11/120,137

(22) Filed: May 2, 2005

(65) Prior Publication Data

US 2007/0174024 A1  Jul. 26, 2007

(51) Int. Cl.
G06F 7/60 (2006.01)
G06F 17/10 (2006.01)
H05K 7/20 (2006.01)

(52) U.S. Cl. .............................. 703/2; 703/7; 361/695
(58) Field of Classification Search ..................... 703/2, 703/7; 361/695
See application file for complete search history.

(56) References Cited

U.S. PATENT DOCUMENTS

| | | | |
|---|---|---|---|
| 5,682,949 A | 11/1997 | Ratcliffe et al. | |
| 5,850,539 A * | 12/1998 | Cook et al. ................... | 703/20 |
| 5,995,729 A * | 11/1999 | Hirosawa et al. ............... | 703/1 |
| 6,134,511 A | 10/2000 | Subbarao | |
| 6,574,104 B2 | 6/2003 | Patel et al. | |
| 6,714,977 B1 | 3/2004 | Fowler et al. | |
| 6,718,277 B2 | 4/2004 | Sharma | |
| 6,721,672 B2 | 4/2004 | Spitaels et al. | |
| 6,862,179 B2 | 3/2005 | Beitelmal et al. | |
| 6,967,283 B2 | 11/2005 | Rasmussen et al. | |
| 7,020,586 B2 | 3/2006 | Snevely | |
| 7,031,870 B2 | 4/2006 | Sharma et al. | |
| 7,051,946 B2 | 5/2006 | Bash et al. | |
| 7,313,503 B2 | 12/2007 | Nakagawa et al. | |
| 7,472,043 B1 | 12/2008 | Low et al. | |
| 2003/0115024 A1 * | 6/2003 | Snevely ........................ | 703/1 |
| 2003/0158718 A1 | 8/2003 | Nakagawa et al. | |
| 2005/0023363 A1 | 2/2005 | Sharma et al. | |
| 2006/0112286 A1 | 5/2006 | Whalley et al. | |
| 2007/0038414 A1 | 2/2007 | Rasmussen et al. | |
| 2007/0078635 A1 | 4/2007 | Rasmussen et al. | |
| 2007/0174024 A1 | 7/2007 | Rasmussen et al. | |

OTHER PUBLICATIONS

N. Rasmussen, "Cooling Strategies for Ultra-High Density Racks and Blade Servers", White Paper #46, pp. 1-22, American Power Conversion, Mar. 29, 2005, published on World Wide Web.

(Continued)

Primary Examiner—Paul L Rodriguez
Assistant Examiner—Dwin M Craig
(74) Attorney, Agent, or Firm—Lando & Anastasi, LLP

(57) ABSTRACT

Systems and methods are provided for determining data center cooling and power requirements and for monitoring performance of cooling and power systems in data centers. At least one aspect provides a system and method that enables a data center operator to determine available power and cooling at specific areas and enclosures in a data center to assist in locating new equipment in the data center.

64 Claims, 14 Drawing Sheets

OTHER PUBLICATIONS

N. Rasmussen, "Strategies for Deploying Blade Servers in Existing Data Centers", White Paper #125, pp. 1-14, American Power Conversion, Mar. 29, 2005, published on World Wide Web.

K. Dunlap, "Cooling Audit for Identifying Potential Cooling Problems in Data Centers", White Paper #40, pp. 1-18, American Power Conversion, May 20, 2004, published on World Wide Web.

N. Rasmussen, "Calculating Total Cooling Requirements for Data Centers", White Paper #25, pp. 1-8, American Power Conversion, May 20, 2004, published on World Wide Web.

"Management Strategy for Network Critical Physical Infrastructure", White Paper #100, pp. 110, American Power Conversion, Dec. 15, 2003, published on World Wide Web.

Innovative Research, Inc., http://web.archive.org/web/20050405003224/http://www.inres.com/, Apr. 5, 2005, published on World Wide Web.

Ashrae, "Thermal Guidelines for Data Processing Environments", American Society of Heating, Refrigerating, and Air-Conditioning Engineers, Inc., 2004, Atlanta.

Bash, C.E., Patel, C.D., and Sharma, R.K., "Efficient Thermal Management of Data Centers—Immediate and Long-Term Research Needs" Intl. J. Heat, Ventilating, Air-Conditioning and Refrigeration Research, 2003, pp. 137-152, vol. 9, No. 2.

Herrlin, M.K., "Rack Cooling Effectiveness in Data Centers and Telecom Central Offices: the Rack Cooling Index (RCI)," Ashrae Transaction, 2005, pp. 725-731, vol. 111(2).

Sharma, R.K, Bash, C.E., and Patel, C.D, "Dimensionless Parameters for Evaluation of Thermal Design and Performance of Large-Scale Data Centers." 8th ASME/AIAA Joint Thermophysics and Heat Transfer Conference, Jun. 24-26, 2002. St. Louis, Missouri.

* cited by examiner

METHODS AND SYSTEMS FOR MANAGING FACILITY POWER AND COOLING

BACKGROUND OF INVENTION

1. Field of Invention

Embodiments of the invention relate generally to methods and systems for managing facility power and cooling.

2. Discussion of Related Art

Centralized data centers for computer, communications and other electronic equipment have been in use for a number of years, and more recently with the increasing use of the Internet, large scale data centers that provide hosting services for Internet Service Providers (ISPs), Application Service Providers (ASPs) and Internet content providers are becoming more prevalent. Typical centralized data centers contain numerous racks of equipment that require power, cooling and connections to external communications facilities. In modern data centers and network rooms, the increased density of computing equipment used in these facilities has put strains on the cooling and power systems of the facilities. In the past, typical power consumption for each equipment enclosure in a data facility was on the order of 1 kW. With the use of server blades and other high power density equipment in equipment racks, it is not uncommon for an equipment rack to have a power draw of 10 kW or even as high as 25 kW.

Typically, the power consumed by computer equipment is converted to heat and typically, the cooling requirements of a facility are determined based on the power requirements of the facility. Typical data centers utilize air plenums under raised floors to distribute cooling air through a data center. One or more computer room air conditioners (CRACs) or computer room air handlers (CRAHs) are typically distributed along the periphery of the data room, and these units draw return air from the ceiling or a ceiling plenum and distribute cooling air beneath the raised floor. Perforated tiles may be placed in front or beneath racks of equipment to be cooled to allow the cooling air from beneath the floor to cool equipment within the racks.

Several tools are available to assist a data center designer in configuring a layout of a data center to provide necessary power and cooling to equipment to be located in the data center. These tools typically assist a designer in determining total power requirements and accordingly overall cooling requirements for a data center. In addition, these tools may assist a designer in determining optimum equipment layout and proper sizing of power cabling and circuit breakers.

While existing tools provide a designer with detailed layout information regarding power distribution, these tools typically provides far less help in determining cooling needs for a facility. Advanced programs that use computational fluid dynamics (CFD) may be used to model the cooling design of a facility, but the use of such programs is extremely limited due to the complexity of the programs, which results in their use being prohibitively expensive and time consuming. U.S. Patent Application US2003/0158718 A1 to Nakagawa et al describes an automated system for designing a cooling system for a facility. In the system of Nakagawa, the facility is divided into a number of pre-characterized cells (such as a cluster of racks) over which the response of various parameters, such as maximum temperature, are known based on key parameters. The system uses built-in cell to cell interaction rules to predict overall thermal performance and to optimize equipment layout. While this system may offer some improvements in speed over a full CFD analysis, it is limited to the use of pre-characterized cells, and does not provide analysis below the cell level. Also, the cells must be characterized using, for example, a CFD analysis or physical testing.

Programs and systems such as those described above provide idealized results for the cooling performance of a facility and often fail to account for situations which often occur in real life installations, which can dramatically affect the cooling performance of a data center. For example, in a facility using a raised floor, the absence of one or more floor panels, or the misplacement of one or more perforated floor panels can greatly affect the cooling performance of the data center and cause the actual performance to vary greatly from a calculated idealized performance. Further, the degradation in performance of one or more air conditioning units can drastically change airflow and cooling characteristics of a facility.

The inability to properly analyze the cooling performance of a facility typically causes a data center designer to over design the facility from a cooling perspective, which results in the facility to be more expensive and less efficient.

In existing data centers, it is often desirable to replace equipment with upgraded equipment and/or add new equipment to existing enclosures in the facility. Several tools exist which enable a manager of a data center to monitor power usage in a facility. These tools include the InfraStruxure™ Manager product available from American Power Conversion Corporation of West Kingston, R.I.

With the increasing cooling and power requirements of computer equipment, it is desirable for a data center manager to determine if there is adequate power and cooling available in the facility before new or replacement equipment may be added. Typically, a data center manager may know, or can determine, if the total cooling capacity of the data center is sufficient for the total power draw. However, hot spots in a facility may develop, particularly where high power density equipment is used, and it may not be enough to merely analyze cooling capacity at the facility level. To attempt to identify hot spots, a data center manager may resort to manual temperature measurements throughout a facility and try to implement fixes to correct the hot spots. Such fixes may involve a rearrangement or replacement of perforated floor panels, a rearrangement of enclosures, and/or adding additional cooling capacity. In any case, these fixes are typically done on a trial and error basis, and while some hot spots may be eliminated, the fixes may cause other hot spots to arise due to a redirection of the cooling air in the facility. This trial and error approach can lead to unexpected failures of equipment, which is unacceptable in critical data centers. To avoid such failures, data center managers typically over design facilities and fail to use facilities to their full capacity.

SUMMARY OF INVENTION

Embodiments of the invention provide systems and methods for determining data center cooling and power requirements and for monitoring performance of cooling and power systems in data centers. At least one embodiment provides a system and method that enables a data center operator to determine available power and cooling at specific areas and enclosures in a data center to assist in locating new equipment in the data center.

A first aspect is directed to a method that includes determining cooling capacity of a number of equipment enclosures in a data center, determining cooling requirements of each of the number of equipment enclosures, and providing an indication of remaining cooling capacity for each of the number of equipment enclosures.

The method may further include developing a floor plan model of the data center, wherein the floor plan model includes a floor plan that indicates location of each of the number of equipment enclosures in the data center, and for each of the number of equipment enclosures, displaying on the floor plan, the indication of remaining cooling capacity. The indication of remaining cooling capacity may include an indication of additional power that can be drawn by each of the number of equipment enclosures based on the remaining cooling capacity. Determining cooling capacity may include calculating a predicted cooling capacity based on the floor plan model. Determining cooling capacity may include measuring airflow at a first plurality of locations in the facility to obtain a measured cooling capacity. Determining cooling capacity may include measuring air temperature at a second plurality of locations in the facility. At least one of the first plurality of locations and the second plurality of locations includes at least one air vent of a raised floor. The method may further include comparing predicted cooling capacity with measured cooling capacity to obtain a comparison result and providing an indication when the comparison result is greater than a threshold. The method may further include adjusting the predicted cooling capacity based on measured airflow. The method may further include determining placement of new equipment in an equipment enclosure in the data center by comparing power ratings of the new equipment with cooling capacity of the equipment enclosure. The method may further include, for each of the number of equipment enclosures, determining electrical power capacity and remaining electrical power availability, and displaying on the floor plan remaining electrical power availability. In the method, determining remaining electrical power availability may include measuring at least one parameter of electrical power provided to at least one of the number of equipment enclosures. In the method, determining cooling capacity of an equipment enclosure may include estimating available cooling air at the equipment enclosure using a weighted summation of available airflows from a plurality of airflow sources, the weights used in the weighted summation may decrease with distance from the equipment enclosure to each of the airflow sources, and the weights may be based on mechanical characteristics of the plurality of airflow sources. The method may further include determining available airflow of at least one of the plurality of airflow devices using at least one of specifications of the at least one of the plurality of airflow devices and measured data for the at least one of the plurality of airflow devices in the data center. The method may further include determining available airflow of at least a second one of the plurality of airflow devices based on the measured data for the at least one of the plurality of airflow devices. In the method, determining cooling capacity may include using superposition to combine airflows. In the method, determining airflow into and out of each of a plurality of sides of each control volume may include computing airflows using equations based on at least one of conservation of mass and conservation of momentum. Further, determining airflow into and out of each of a plurality of sides of each control volume may include determining airflows using empirical rules.

A second aspect of the invention is directed to a system for managing a data center. The system includes at least one input to receive data related to equipment and equipment enclosures and to receive data related to cooling characteristics of the data center, a controller operatively coupled to the input and configured to determine cooling capacity of each equipment enclosure, and at least one output operatively coupled to the controller that provides an indication of remaining cooling capacity for each of the equipment enclosures.

The system may further include an output device coupled to the at least one output, wherein the system is configured to display a floor plan of at least a portion of the data center indicating location of at least one of the equipment enclosures in the data center and indicating the remaining cooling capacity for the at least one of the equipment enclosures. The output device may be configured to include an indication of additional power that can be drawn by the at least one of the equipment enclosures. The system may further include at least one airflow monitor operatively coupled to the controller to provide data related to at least one airflow in the data center. The system may further include at least one air monitor operatively coupled to the controller to provide data related to air temperature at a location in the data center. The controller may be configured to compare a predicted cooling capacity with a measured cooling capacity to obtain a comparison result and to provide an indication when the comparison result is greater than a threshold. The system may further include at least one power monitor operatively coupled to the controller, and at least one airflow controller operatively coupled to the controller and responsive to signals from the controller to alter cooling airflow in the data center. The system may further include at least one power controller operatively coupled to the controller and responsive to signals from the controller to alter at least one characteristic of power in the data center.

A third aspect of the invention is directed to a system for managing a data center. The system includes at least one input to receive data related to equipment and equipment enclosures and to receive data related to cooling characteristics of the data center, and means, coupled to the at least one input, for determining remaining cooling capacity for each of the number of equipment enclosures and providing an indication of remaining cooling capacity.

The system may further include means for providing an indication of additional power that can be drawn by each of the equipment enclosures and means for updating the indication of remaining cooling capacity based on measured airflows in the data center. The system may still further include means for determining placement of equipment in the data center based on remaining cooling capacity, and means for estimating available cooling air of at least one of the equipment enclosures using a weighted summation of available airflows from a plurality of airflow sources.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
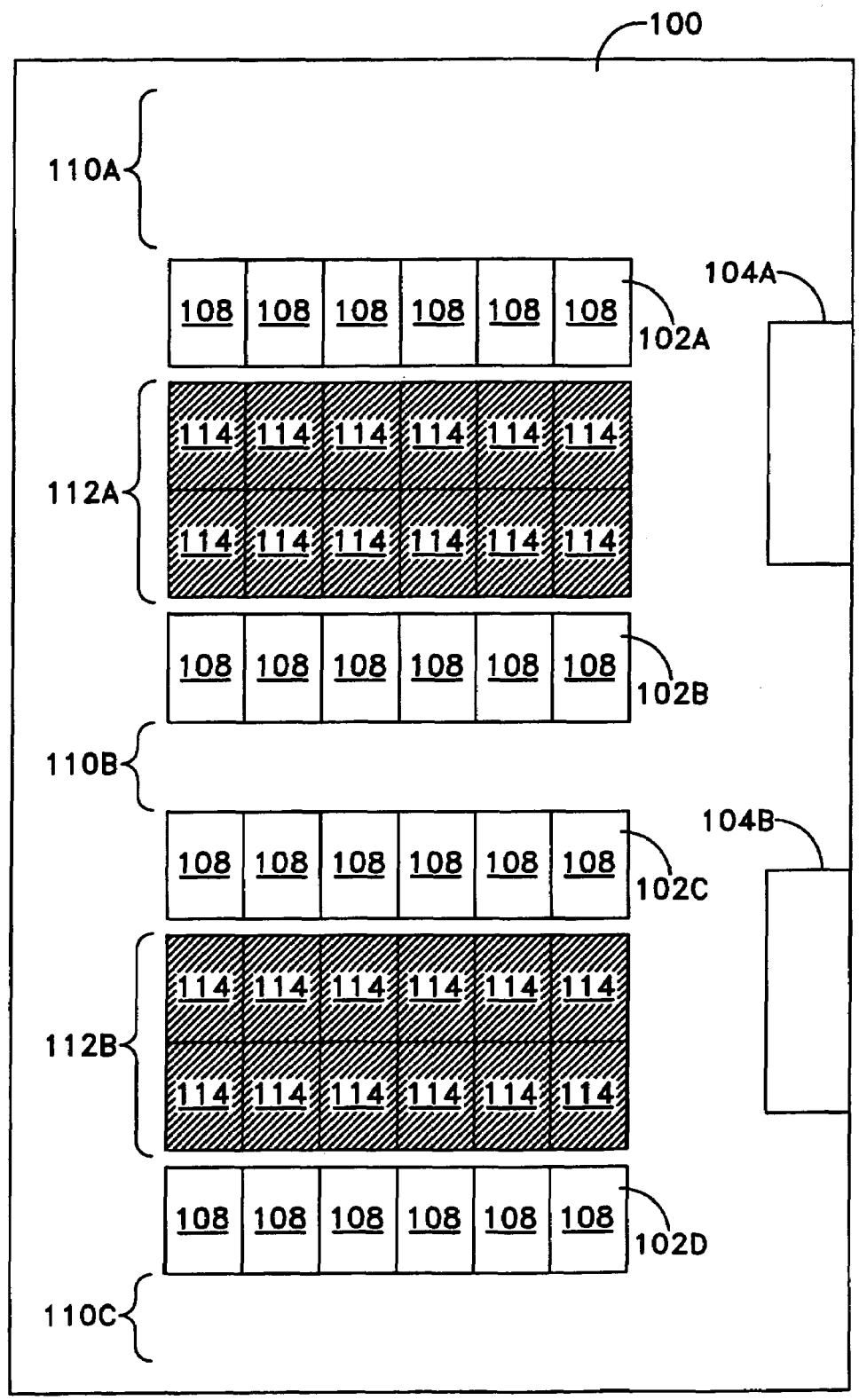
FIG. 1 is a top view of a data center of the type with which embodiments of the present invention may be used.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

Figure 2:
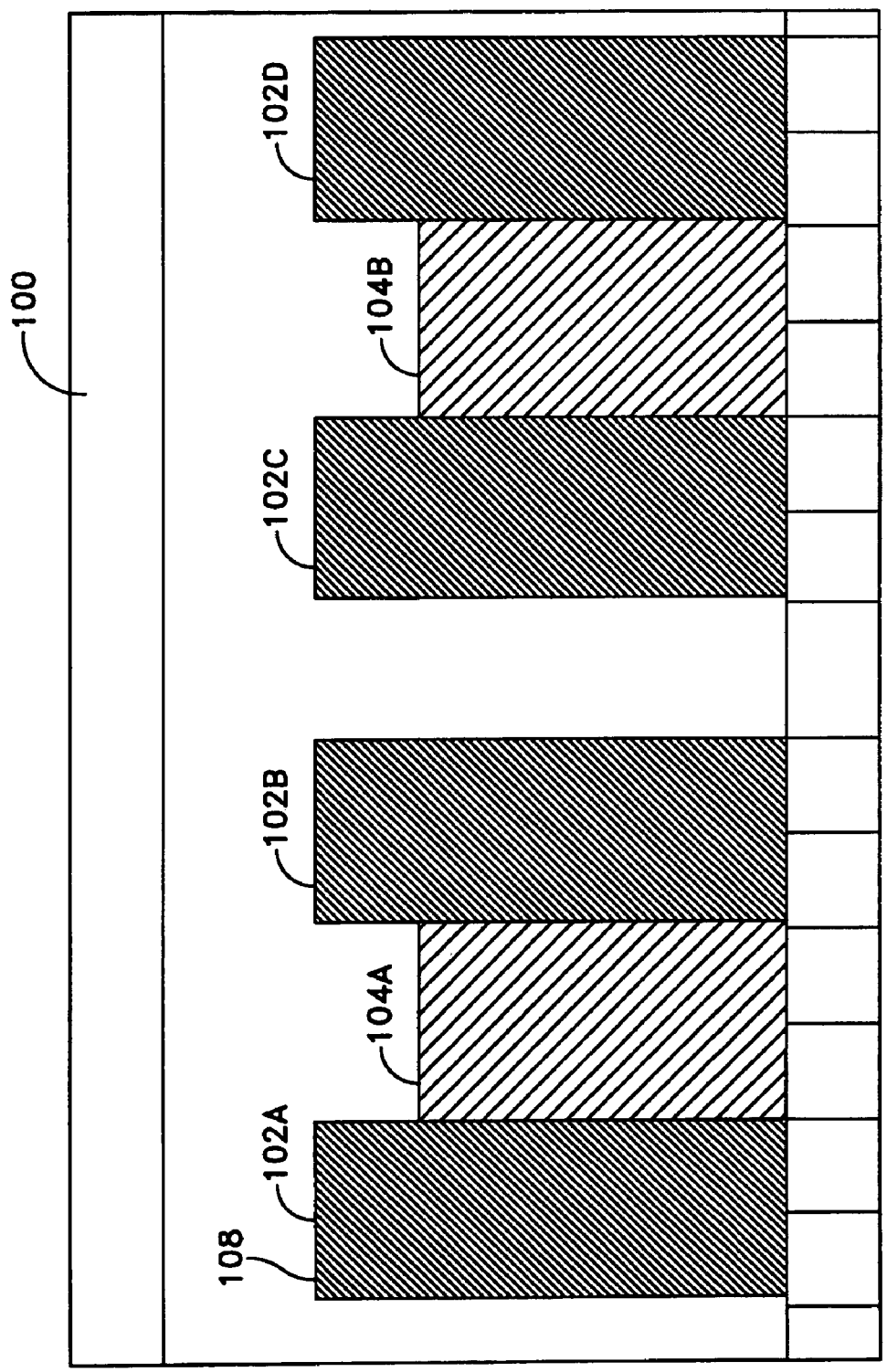
FIG. 2 is a side view of the data center of FIG. 1.

Embodiments of the present invention may be used to design, manage and retrofit a data center, such as data center 100 which is shown in FIGS. 1 and 2 with FIG. 1 showing a top view of the data center 100, and FIG. 2 showing a side view of the data center 100. As discussed further below, the design of the layout of the data center 100, including power and cooling considerations may be performed using systems and processes of embodiments of the present invention. Embodiments of the invention, however, are not limited for use with data centers like that shown in FIGS. 1 and 2 and may be used with other facilities that do not include raised floors and may be used with facilities that house equipment other than computing equipment, including telecommunications facilities and other facilities. Further, embodiments of the invention may be used with raised floor and equipment layouts that are not neatly arranged in the manner shown in FIGS. 1 and 2. Embodiments of the present invention may use systems, devices and methods described in U.S. patent application Ser. No. 10/038,106, filed Jan. 2, 2002, titled "Rack Power System and Method," incorporated herein in its entirety by reference.

The data center 100 includes rows of racks 102A, 102B, 102C and 102D, cooling units 104A and 104B, and a raised floor 106. Each of the rows includes racks 108, at least a number of which draw cool air from the front of the rack and return warm air to the rear of the rack. As understood by those skilled in the art, to optimize cooling performance in a data center, rows of racks are often positioned to create alternating cold aisles and hot aisles. In the configuration shown in FIGS. 1 and 2, aisles 110A, 110B and 110C are hot aisles and aisles 112A and 112B are cold aisles. To provide cooling to the racks, in front of each of the racks in the cold aisle, perforated floor tiles 114 are used to provide cooling air from under the raised floor. In the data center 100, in addition to the perforated floor tiles shown, the raised floor may include solid floor tiles. The cooling units 104A and 104B are designed to provide cool air to the area under the raised floor and to receive return warm air from the space adjacent the ceiling of the data center.

Figure 3:
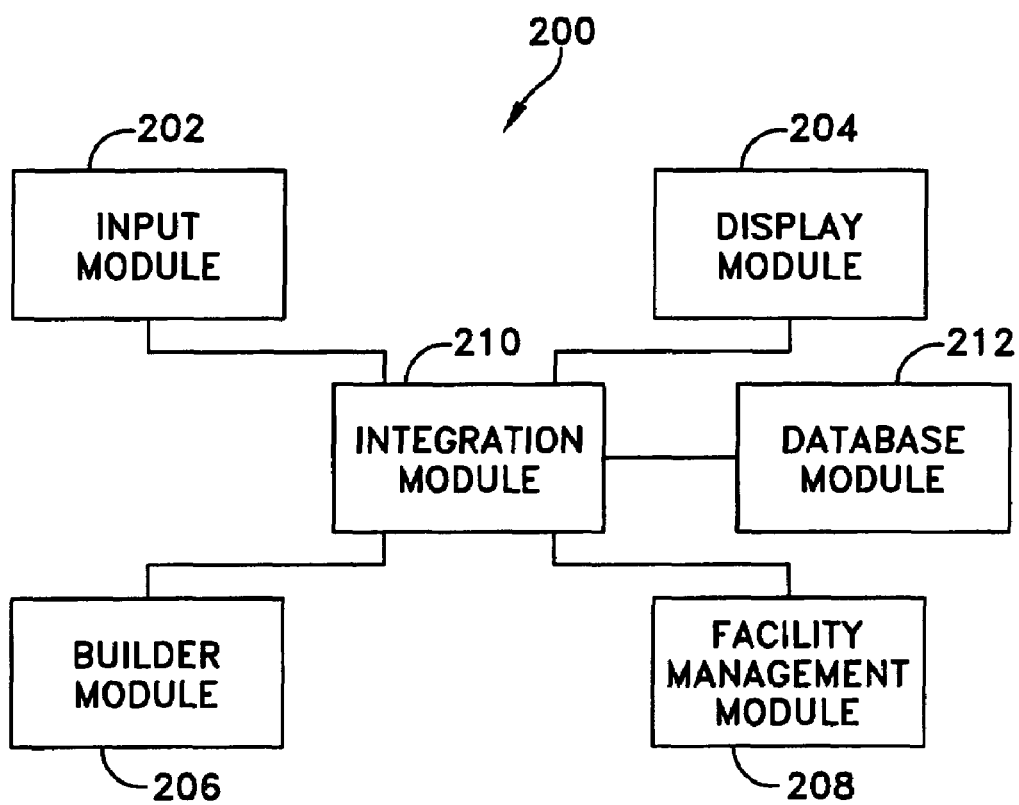
FIG. 3 is a functional block diagram of a system in accordance with one embodiment of the present invention.

One embodiment of the invention, directed to a system and a method for designing, monitoring, and upgrading the equipment installed in a data center, such as data center 100 will now be described with reference to FIG. 3. FIG. 3 shows a functional block diagram of a design and management system 200. Embodiments of the invention are not limited to the functions provided by the functional blocks or the particular arrangement of the blocks. In addition, the functions provided by the system 200 need not be implemented on one computer system, but rather may be implemented using a number of networked devices as described further below that provide the functions described. Further, particular embodiments may have more or less functions and functional modules than those described below with reference to FIG. 3.

The system 200 includes an input module 202, a display module 204, a builder module 206, a facility management module 208, an integration module 210, and a database module 212. The input module 202 provides an interface to allow users to enter data into the system 200. The input module may include, for example, one of a number of known user input devices for computer systems, and in addition, in at least one embodiment, electronic data regarding a facility and/or equipment to be loaded into a facility may be entered into the system through a network interface or using an electronic media storage reader.

The display module includes a display interface and may include a graphical display to display output data to a user. In addition, the display module may include an interface for one or more printers that provide a hard copy of output data.

The builder module 206 includes routines for designing optimal layout of equipment in a facility, determining power requirements and cooling requirements for electronic enclosures, ensuring that the placement of equipment, cooling units and power distribution branches in the facility allow the power and cooling requirements to be met, and calculating for each electronic enclosure the remaining power capacity and cooling capacity available based on the layout of equipment in the facility.

The facility management module 208 is used by the system 200 after equipment is installed in the facility. The management module includes routines to monitor power and cooling characteristics of equipment in a facility. The management module may be coupled, either directly or through one or more networks, to measurement devices and control devices throughout the facility.

The integration module 210 is the main module in the system and coordinates flow of data in the system to perform methods of embodiments of the present invention.

The database module is used to store data regarding various devices that may be used in a data center, such as servers, uninterruptible power supplies, air conditioning units, racks and any other equipment. The data stored may include physical parameters (i.e., dimensions) as well as power and cooling consumption data, and in the case of power supplies and air conditioning units may include cooling and power output characteristics.

A flow chart of a method 300 in accordance with one embodiment that may be performed using the system 200 will now be described with reference to FIG. 4. Initially, at stage 302 of the method 300 information regarding the facility is loaded into the system. The information includes, for example, dimensions of the facility, locations of doors, support columns, parameters of available power, cooling capabilities of the facility, whether a raised floor or drop ceiling is in use, and characteristics of any such floor and roof.

In stage 304 of the method, information regarding equipment to be installed in the facility is entered. The information includes, for example, the number of racks of equipment, maximum power draw for each of the racks, dimensions of the racks, and cooling requirements for the racks. The need for backup power sources and multiple power sources for equipment and or racks may also be entered at stage 304. In one embodiment, characteristics of individual pieces of equipment that are to be loaded into racks may also be entered. These characteristics may include, in addition to power and cooling requirements, the amount of rack space that the equipment needs to occupy. In one embodiment, the database module 212 contains information regarding a number of devices, such as uninterruptible power supplies, cooling units and servers. In this embodiment, when a particular model number of a device is entered, characteristics of the device are retrieved from the database module.

Once all of the information is entered into the system, at stage 306, the system in one embodiment determines a layout for the equipment in the facility, taking into account the power and cooling requirements of the equipment as well as other characteristics of the equipment that were entered at stage 304 or retrieved from the database module. In another embodiment, the user may create the layout graphically, adding racks and other equipment where desired, and in this embodiment, the system will provide feedback during the layout process, disallowing some choices and making intelligent suggestions. These rules may include, for example: a standard alternating hot aisle/cold aisle layout must be specified, the plenum must be greater than some minimum value, the total room cooling capacity must exceed total room cooling load, aisles must be wide enough for access purposes and to meet building codes, distance between PDU and IT racks served by the PDU must not exceed some maximum value, PDU must be located immediately adjacent to a UPS, where a cable ladder spans an aisle, the aisle cannot exceed a maximum width, etc.

Next, at stage 308, a cooling analysis is conducted to determine if the design provides adequate cooling for each of the racks and the equipment installed in the racks. As described further below, in different embodiments of the present invention one of a number of different methods may be used to conduct the cooling analysis. In one embodiment, if the results of the cooling analysis indicate that one or more devices and/or racks are not receiving adequate cool air, then the procedure may return to stage 306 to change the layout of the equipment based on feedback provided from the analysis conducted at stage 308.

At the completion of the cooling analysis, at stage 310, a room model is displayed showing the locations of the equipment in the facility. The room model may include, for each equipment rack, information regarding the total power and cooling being consumed as well as an indication of total available power and cooling to the rack. In one embodiment actual power and cooling data may be displayed, while in other embodiments colors may be used, either alone or in combination with data, to display different levels of power and cooling availability. For example, if a rack is operating with sufficient cooling air with a margin above a threshold, the rack may be indicated in green on the display, if the cooling air availability is closer to the threshold, the rack may be indicated in yellow, and if the rack does not have sufficient cooling air it may be indicated in red. Specific details regarding the room model is described further below with reference to FIG. 5.

At decision block 312, a determination may be made by, for example, a facility designer as to whether the layout generated in stage 310 is satisfactory. The determination may be based on additional criteria of importance to the designer that was not included during the design of the original layout. For example, it may be desirable to have certain racks near each other or to have certain racks isolated from one another. At stage 314, additional criteria or other feedback can be provided and the process then returns to stages 306 and 308 where the room model can be refined. Stages 306 to 312 may be repeated until a satisfactory model is achieved at stage 312.

At stage 316, the equipment is installed in the facility according to the layout generated at stages 306 to 314. In one embodiment, measurement equipment to measure cooling characteristics and power characteristics may be installed with the equipment. The measurement equipment is described further below, and may include, for example, devices for measuring power, airflow and temperature at various locations in the facility and within equipment racks located in the facility.

At stage 318 of the process 300, power and cooling parameters are measured using the measurement equipment. Additional temperature measurements may also be provided by devices, such as servers, that have the capability to detect internal temperatures. The parameters measured may be used continuously by the management module of the system 200 to detect error conditions and to monitor trends that may lead to an error condition. Further, in the process 300, the measured parameters can be compared with predicted parameters calculated during the design process in stages 306 and 308. For example, in one embodiment, the airflow through a perforated floor tile of a raised floor is used to determine the available cooling air of a rack located adjacent the floor tile. The airflow through the perforated tile may be determined in stage 308 using one of a number of computational methods that are described further below or the airflow may be determined using data from related physical measurements or simulations. Once the equipment is installed in the facility, the perforated floor tile may be instrumented to measure the actual airflow through the tile. The actual measured value may then be compared with the calculated value at stage 320. If the two differ by more than a predetermined threshold, then an indication or warning may be provided and the calculations conducted in stage 308 may be conducted once again at stage 322 using measured values in place of calculated values as appropriate to obtain updated parameters.

After stage 322, the model of the facility described above with reference to stage 310 may be displayed with values of power and cooling availability and consumption updated to reflect any differences between measured parameters and calculated parameters. Any out of tolerance conditions (for either cooling or power) may be indicated on the display using, for example, a color coded scheme as described above. In one embodiment, a user may be provided with a number of available options to correct an out of tolerance condition. The options may include upgrading or adding facility equipment (i.e., an air conditioning unit or an uninterruptible power supply) or may include moving equipment and/or racks. Stages 318 to 322 of the process may be performed continuously as part of a management system of the data facility.

In one embodiment of the invention, stages 302 to 314 of the process 300 are implemented using a build-out system accessible by a user over the Internet. In this embodiment, the user provides the requested information, and the build-out system provides the processing described above, provides outputs to the user over the Internet, and stores results locally. After the equipment has been installed in the facility, the management system 500 (described below) may access the build-out system to download information related to the equipment. In addition, when a retrofit of the facility is to occur, the management system may contact the build-out system to coordinate the design of the retrofit.

Figure 5:
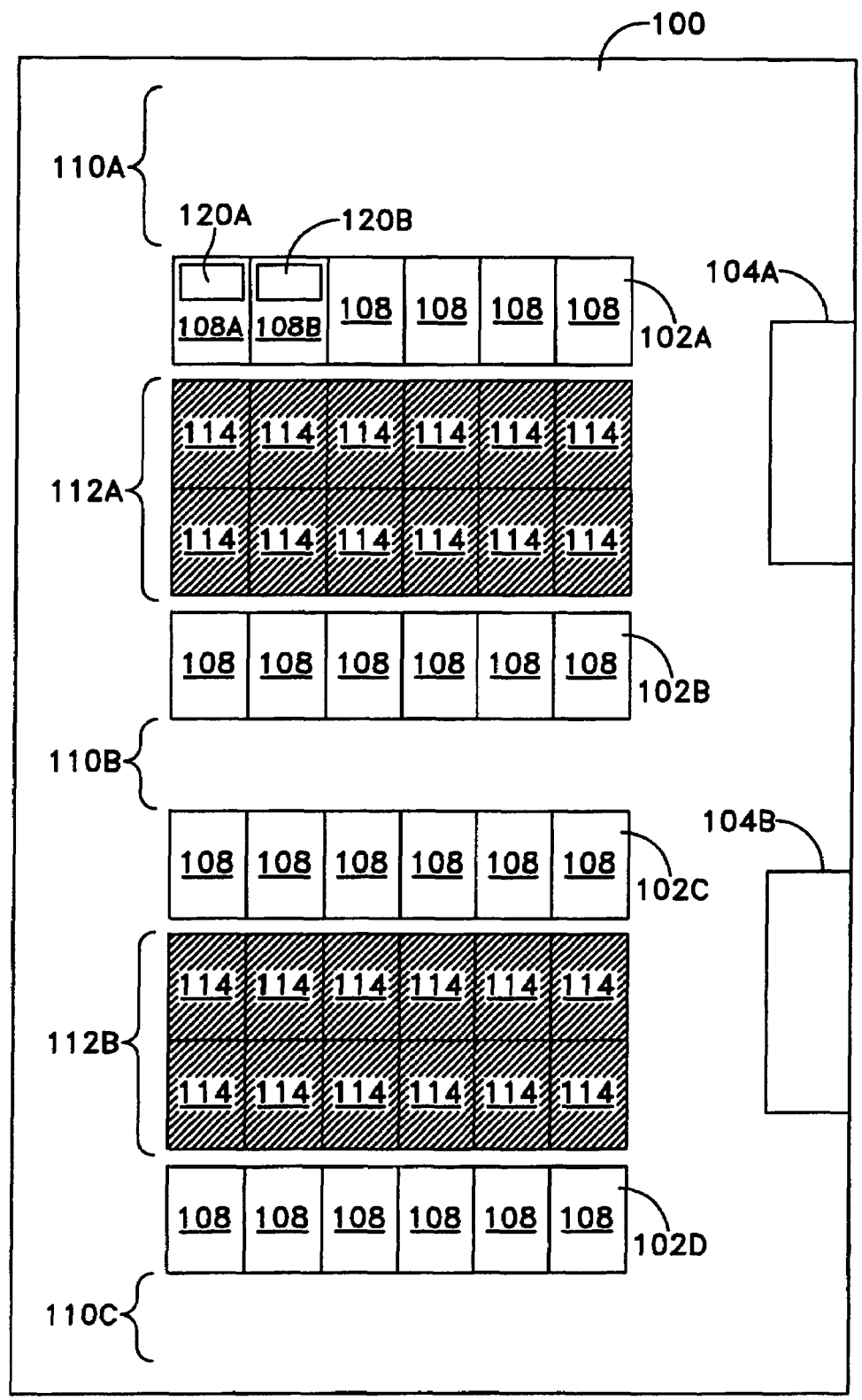
FIG. 5 is a diagram showing facility information that can be displayed using at least one embodiment of the invention.

FIG. 5 shows an example of a display of a room model that may be generated using the system 200 and the process 300. The room model shown in FIG. 5 is essentially the data center 100 previously discussed above with reference to FIGS. 1 and 2, however, in FIG. 5, additional data related to the power and cooling consumption and capacity of each rack may be included in an informational block, such as informational blocks 120A and 120B shown on two of the racks 108A and 108B in FIG. 5. Informational blocks may be included on each rack, or on less than all racks.

Figure 5A:
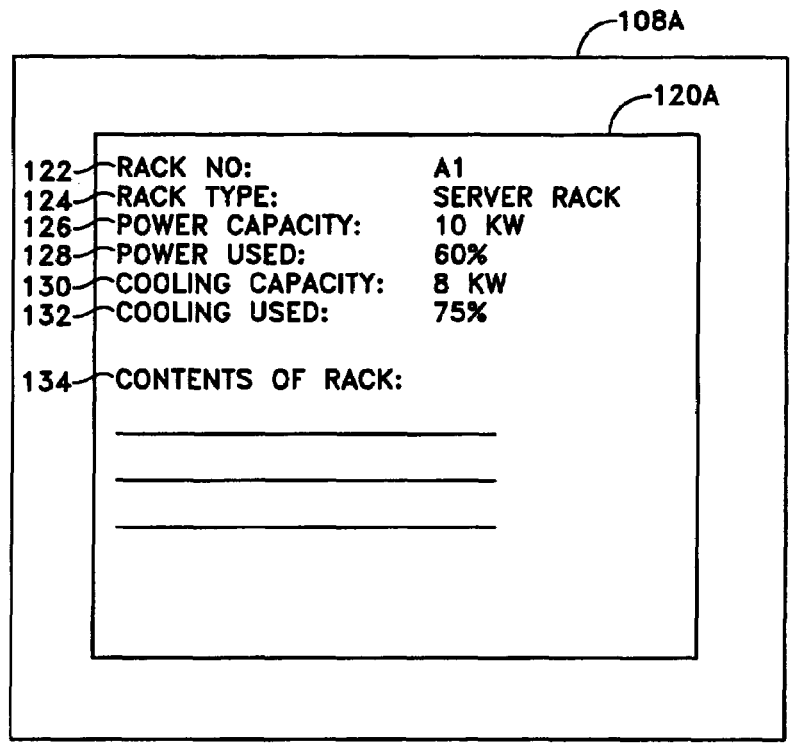
FIGS. 5A and 5B are diagrams showing additional information that can be displayed using embodiments of the invention.
Figure 5B:
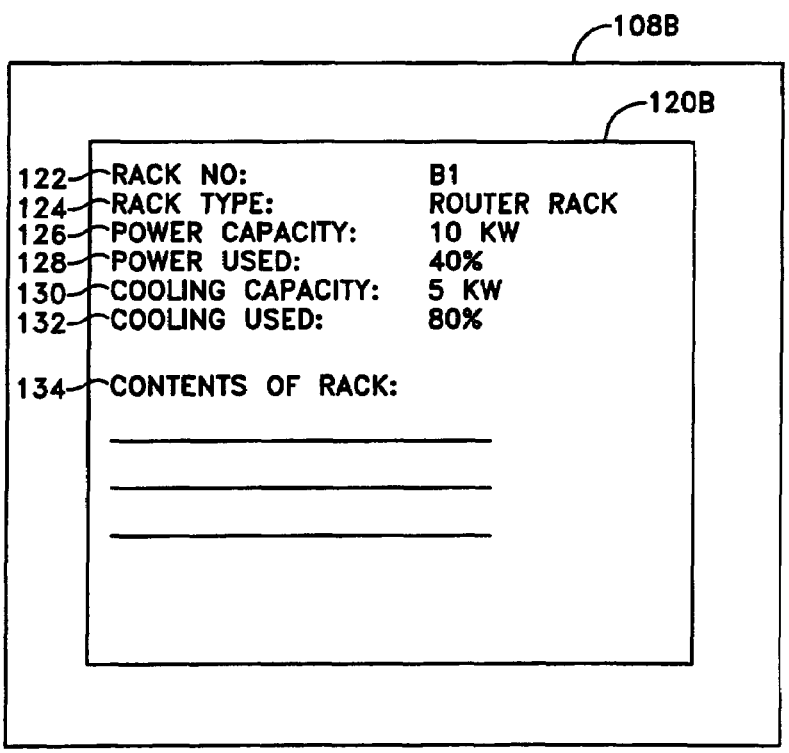

FIGS. 5A and 5B show enlarged views of respectively racks 108A and 108B. In the views of FIGS. 5A and 5B, specific information regarding the racks is included in the informational block. In the embodiment shown, the information in the block includes a rack identifier 122, a rack type 124, power capacity 126, power usage 128, cooling capacity 130, cooling usage 132 and contents of the rack 134.

The rack identifier 122 includes a row number and a rack number, however, in other embodiments, the rack identifier may also include an indicator of the type of rack, manufacturer of the rack, as well as other information. The rack type 124 identifies the particular type of rack, i.e., server rack, router rack. The power capacity 126 indicates the maximum power capacity of the rack, and the power usage indicator 128 indicates the percentage of maximum capacity at which the rack is expected to operate. In different embodiments, the power usage indicator may be calculated based on manufacturer supplied data for equipment contained in the rack and/or based on actual power measurements of equipment. The power capacity for a rack, in at least one embodiment, is determined based on limitations of devices and/or power cables that supply power to the rack, such as circuit breakers, UPS's or any other devices. The contents of the rack 134 includes a list of the equipment contained in the rack and may include an indication of remaining space in the rack displayed, for example, in terms of rack units, which are typically referred to as "U" with 1 U equal to 1.75 inches.

The cooling capacity indicator 130 and cooling usage indicator 132 identify respectively the quantity of cooling air available to the rack and the percentage of that cooling air that is being used by equipment in the rack. In the embodiment shown in FIGS. 5A and 5B, the cooling capacity is shown in terms of kilowatts (kW). As known to those skilled in the art, for typical data center applications, many equipment racks typically require approximately 160 cfm (cubic feet per minute) of cooling air per kilowatt of power used by the rack. All the power consumed by computing type devices is typically converted to heat, such that the required cooling (in terms of kW) for a rack can be assumed to be equal to the power consumption of the rack. Accordingly, in one embodiment, the cooling usage indicator is equal to the power consumed by the rack. In other embodiments, depending on the type of equipment that is installed in the racks, the cooling required by a rack may not be equal to that consumed by the rack and may be calculated based on manufacturer's data for the equipment, based on test results, or in any other manner.

The cooling capacity of an equipment rack is determined based on a number of different factors. For example, for a raised-floor environment, these factors may include: location of the rack in the facility, proximity of perforated tiles to the rack, the amount and temperature of cooling air provided through any such perforated tile, the physical or geometric layout of the racks and building, and the cooling requirements of other equipment in the facility located near the rack. The cooling capacity of one rack in a facility may be affected by the cooling usage of nearby racks, and accordingly, in one embodiment, the cooling capacity of a rack is adjusted when the cooling usage of a nearby rack is changed. In at least one embodiment of the present invention, calculations for determining cooling capacity of a rack are based in part on the ability of one rack to borrow cooling air available to adjacent racks. Particular methods for determining cooling capacity for racks in embodiments of the present invention are described further below. In one embodiment, when the cooling usage of one rack is changed, the cooling capacity of that rack, and all racks located near the changed rack is recalculated.

Figure 4:
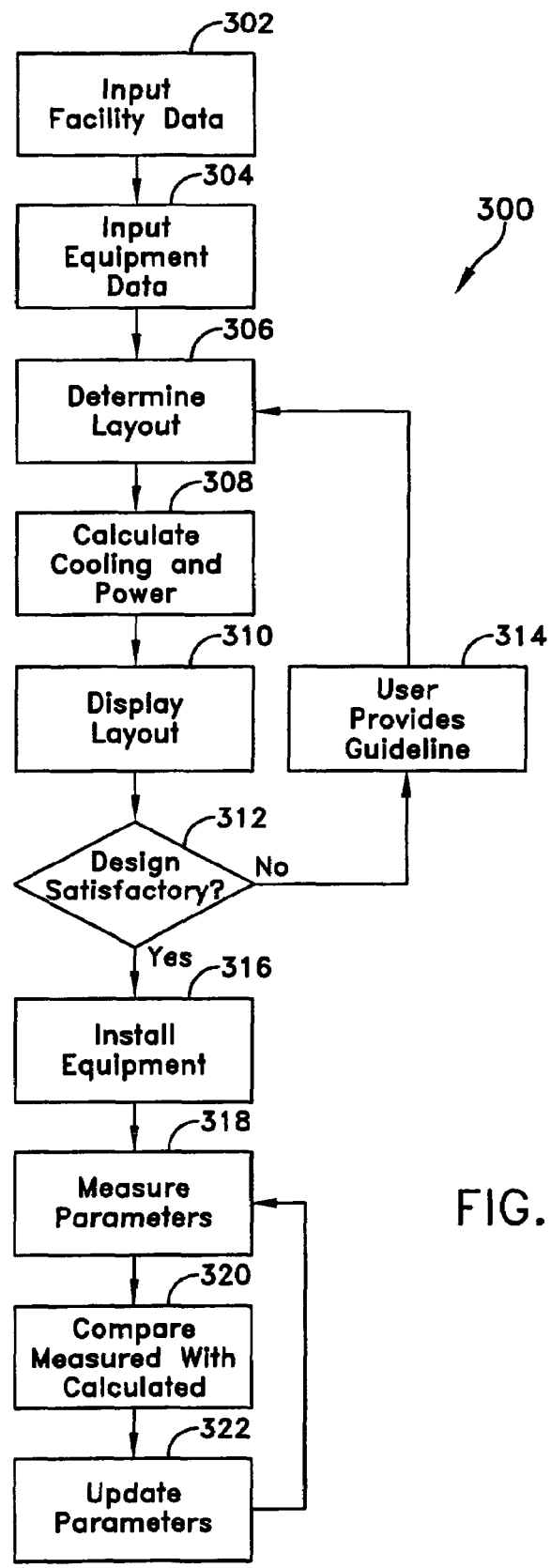
FIG. 4 is a flowchart of a process that may be implemented using the system of FIG. 3 in accordance with one embodiment of the invention.

As discussed above, with reference to the process shown in FIG. 4, the system 200 may be used as part of a data center management system. The management system may include the system 200 described above with the management module containing routines to perform management functions, or in other embodiments, the management functions may be performed by a designated manager controller contained in the data center and implemented, for example, in a computer server located in one of the racks of equipment and accessible by a user using a management console.

Figure 6:
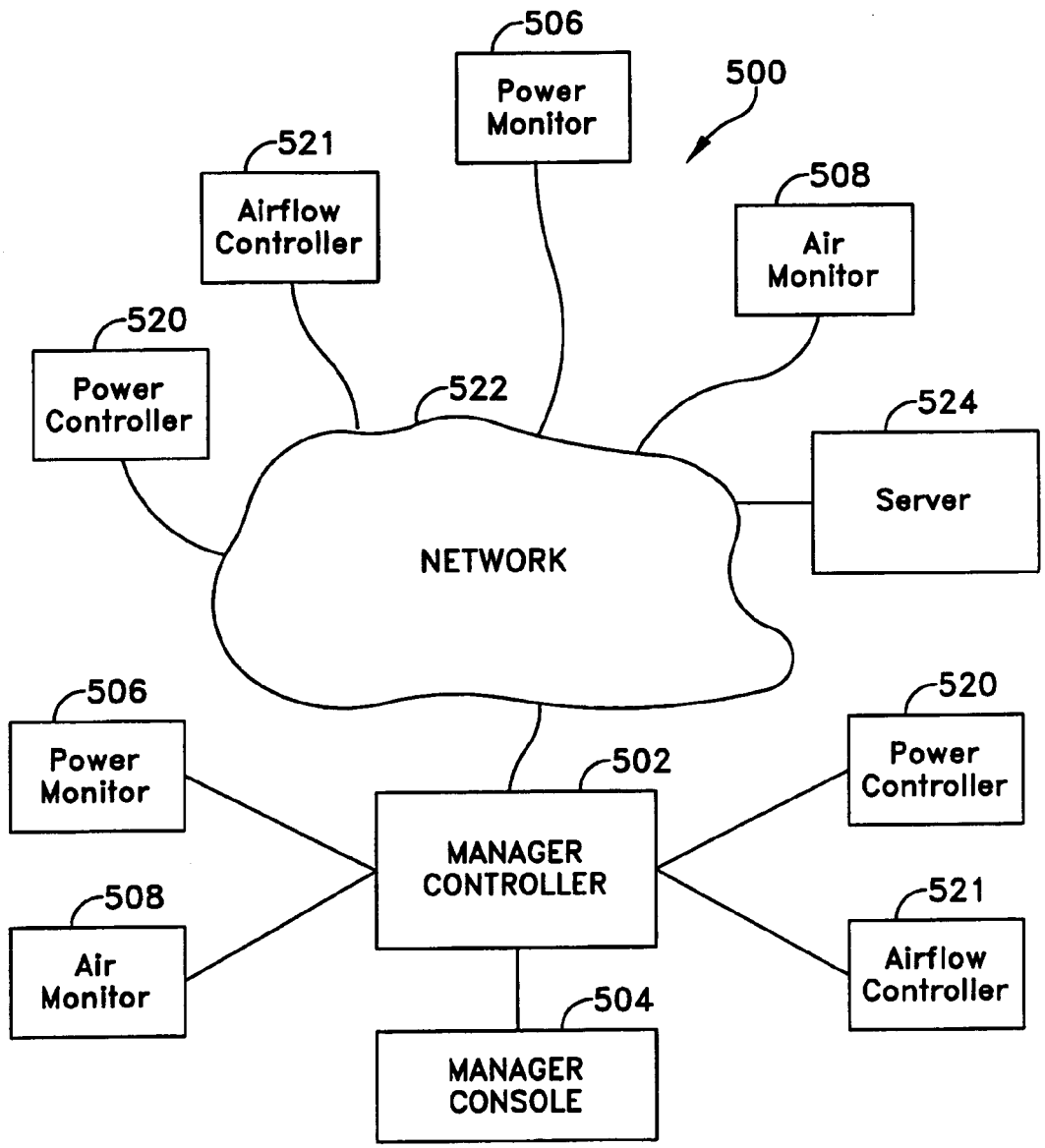
FIG. 6 is a functional block diagram of a management system in accordance with one embodiment of the invention.

FIG. 6 shows a block diagram of a management system 500 that may be used in embodiments of the present invention. The management system includes the manager controller 502, the manager console 504, power measurement devices 506, and airflow and temperature measurement devices 508. In addition, in one embodiment, the management system may include power control devices 520 to control application of power to one or more individual devices or racks contained within a data center, and the system may include airflow controllers 521 to control the airflow or supply temperature of an air conditioning unit or to control, for example, perforated tile dampers. The devices of the management system 500 may be directly coupled to the manager controller or may be coupled to the manager controller using a network 522 that may be a dedicated network, may include the Internet, or may include a LAN or WAN contained in the data center. The manager controller may communicate with one or more servers 524 to obtain information from and control operation of the servers.

In one embodiment, the management controller 502 may be implemented at least in part using an Infrastruxure® Manager available from American Power Conversion Corporation (APC) of West Kingston, R.I. The power controllers and airflow controllers may be implemented using available known devices that monitor and/or control power and airflow in facilities. Further, in at least one embodiment, the management system 500 may include systems and methods for monitoring and controlling power as described in U.S. Pat. No. 6,721,672 to Spitaels et al, which is incorporated by reference herein.

Figure 7:
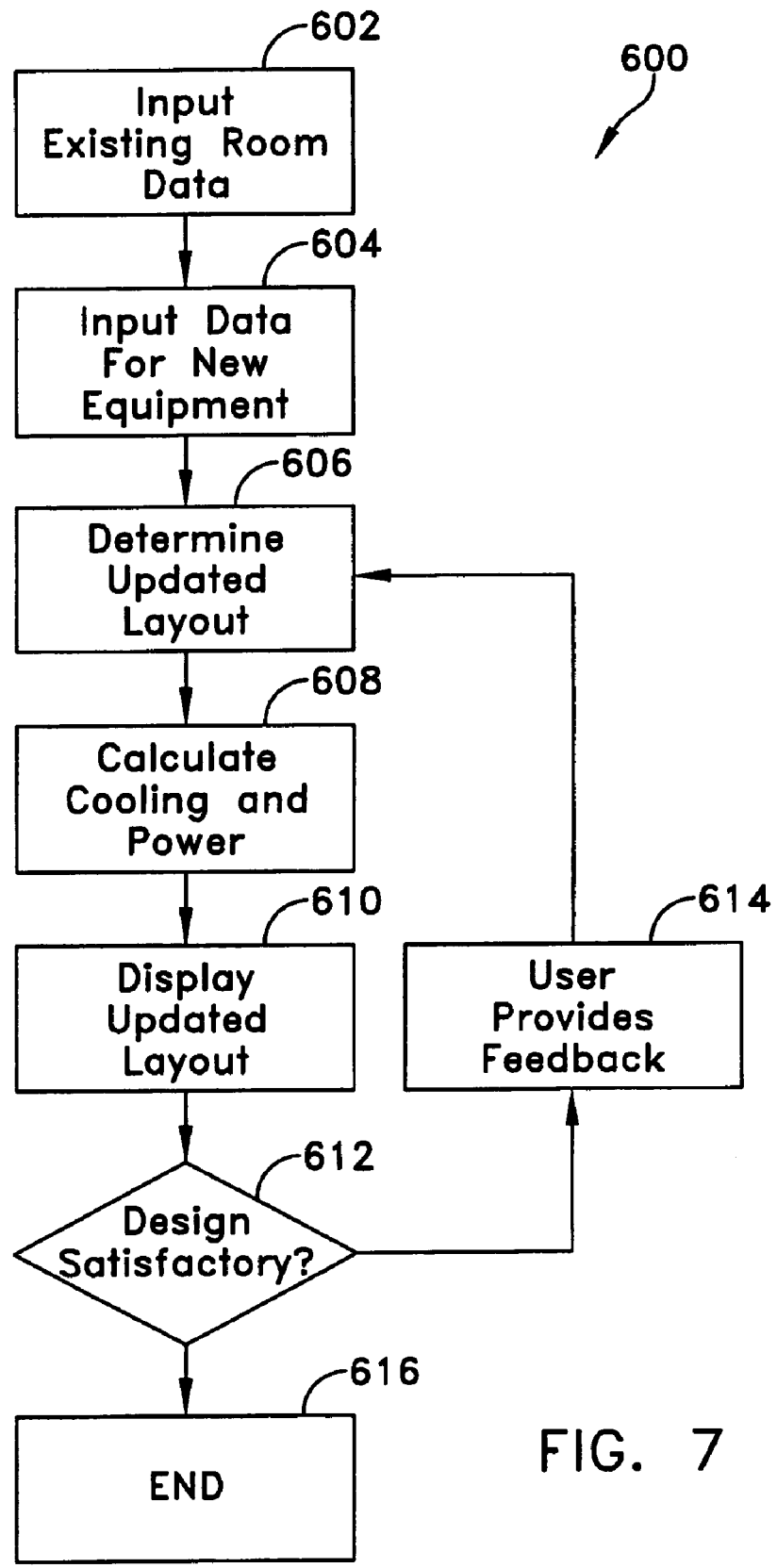
FIG. 7 is a flow chart of a management process in accordance with one embodiment of the invention.

One aspect of the present invention, which will now be described, is directed to a retrofit system and method that is particularly useful for adding new equipment to a facility. The addition of new equipment may include adding equipment to existing racks or may include adding equipment racks to a facility. The retrofit system may be a standalone computer system configured to perform processes described herein, or in one embodiment, the retrofit system is implemented using the system 200 described above. Specifically, the builder module 206 of the system 200 may include routines to assist in retrofitting a data center. A process 600 for using the system 200 (or some other system) to retrofit or upgrade a data center will now be described with reference to FIG. 7, which shows a flow chart of the process 600.

In a first stage 602 of the process 600, data related to a present configuration of a data center to be retrofitted is provided to the builder module. The data related to the present configuration may include the data displayed in the room model of FIG. 5 along with additional data that was generated during design of the data center. Further, in one embodiment, the data related to the present configuration may include data generated during an initial design as updated by actual measurements conducted in a facility. For example, the cooling capacity of individual racks may be calculated in an initial design and then updated by the management module once the system is installed and operating. Cooling capacity data may be updated based on actual measurements of airflow from perforated floor tiles, while the original data may have been calculated based on predicted airflows.

Information related to the retrofit is then provided in stage 604. The information related to the retrofit may include information similar to that input at stage 304 of process 300 described above, such as type of equipment, characteristics of equipment, number of racks, as well as other information. In addition, a user may designate one or more desired locations in the data center for the installation of new equipment. For example, a user may desire to add five additional servers to the data center, where the servers are similar to and have a related function to existing servers in the data center. The user may choose one or more preferred locations based on power specifications, cooling specifications and physical dimensions of the servers, and based on power capacity, cooling capacity and contents of existing racks displayed on a floor model of the data center. In addition, the user may indicate whether it is acceptable to move existing equipment to accommodate the installation of new equipment.

At stage 606, an updated layout for the data center is generated and cooling and power calculations are performed at stage 608 on the updated layout in the manner discussed above at stage 308 of process 300. If the user has designated specific locations for equipment in the data center, the layout may first be determined using these locations, and if problems arise as a result of the desired layout (i.e., lack of cooling for a rack), then the user will be able to note any such problems once the layout is displayed and can then choose to change the layout. If a particular layout is not designated by a user, then the system 200 will determine the layout in the manner discussed above with respect to stage 306 of process 300.

At stage 610, an updated floor model is displayed, and at stage 612, a user can review the model and either provide feedback (stage 614) or indicate that the design is satisfactory. Once the floor model has been approved by a user, the retrofit design process is complete, and the equipment may be installed and parameters of the data center may be measured and updated in the manner described above in stages 318 to 322 of process 300 using for example a data center management system.

In the processes 300 and 600 described above, design and analysis stages are performed after all data is entered as part of an initial design or a retrofit of a facility. In another embodiment, analysis is performed real-time, and user displays are updated as the user enters data into the system.

In embodiments of the present invention, using the processes described above, data center operators are able to determine, in essentially real-time, whether additional equipment may be added to a data center and may also determine locations for the equipment, where both power and cooling requirements of the equipment may be met.

In the processes and systems described above, cooling calculations for a data center and for equipment in the data center are performed as part of the design process for the data center, during operation of the data center, and during an upgrade or retrofit of the data center. In embodiments of the present invention, in determining equipment layout and performing cooling calculations, initial information on characteristics of the facility itself are identified to determine if there is sufficient cooling at the facility level. These characteristics include, for example, whether a raised floor or drop ceiling is used as an air plenum, the location and characteristics of air conditioning units, dimensions of the room that are to house the data center, and total power draw of the data center. Based on this information, an initial determination may be made as to whether there is sufficient cooling provided by the air conditioning units for the expected power draw in the room, and if not, a recommendation may be made for additional air conditioning units. For some facilities, desired redundancy and operating margins may be included in this determination.

Once the determination has been made that there is sufficient cooling at the facility level, an analysis is conducted to determine if there is adequate cooling at each rack in the facility and/or at individual pieces of equipment. In different embodiments of the present invention one or more of a number of different methods may be used to perform the cooling calculations. These methods include, but are not limited to, a computational fluid dynamics (CFD) analysis, a Coarse-Grid CFD analysis (designated as CGCFD), a control volume analysis (designated as CVA), and an analysis based on empirical rules and/or borrowing concepts. Further, in some embodiments, a combination of two or more of the above methods may be used to conduct portions of an overall analysis. In one embodiment, the principle of superposition is used to combine results of portions of an analysis. In particular, in many applications the airflows may be considered to be ideal, where an ideal airflow is inviscid, incompressible, irrotational without any other forces, such as buoyancy. With such an ideal airflow, a complex application can be reduced to a number of less complex applications, analysis of the less complex applications can be performed using one of the methods described herein, and superposition can be used to combine the results of each of the less complex applications to obtain analysis results for the complex application.

A computational fluid dynamics analysis can be used in one embodiment in association with the design and retrofit of a data center to provide detailed results of the cooling performance of a facility, including determining the availability of adequate cooling air at racks and individual pieces of equipment in the facility and determining cooling capacity for each rack. The techniques for implementing a CFD analysis of a data center are known. A CFD analysis must typically be performed by someone particularly skilled in the art, typically requires detailed information regarding the facility and the layout of equipment in the facility, and depending on the complexity of the analysis conducted, and the computing equipment used to conduct the analysis, may take hours or days to run one iteration of the analysis.

In another embodiment, an improved technique for conducting the cooling analysis is used. The improved technique has been developed based on computational fluid dynamics techniques. The improved technique is referred to herein as a Coarse-Grid CFD or simply CGCFD. In a typical CFD analysis, a data center to be analyzed is typically divided into non-uniform cells in the range of one to eight inches on a side. In at least one embodiment, in the CGCFD analysis, a Cartesian grid system of cells that are one foot cubes are used. The use of uniform one foot cells typically reduces the number of cells used in the calculations from a traditional CFD analysis by at least an order of magnitude. Further, uniform grid cells generally make the CFD analysis faster and more reliable relative to a comparable non-uniform cell analysis. Further, other techniques are employed in the CGCFD analysis to improve the computational efficiency of the analysis. These techniques include: the use of simple turbulence models, initializing the analysis with data obtained from the results from a prior similar solution, using two dimensional or partial two dimensional representations when possible to simplify calculations, and tailoring a CGCFD routine for a specific application. The use of two dimensional representations may be used, for example, in a raised floor or ceiling plenum, where pressure gradients in the depth direction can be neglected in the computations.

The tailoring of a CGCFD routine can be used in embodiments of the present invention to significantly improve computational efficiency and improve robustness (for example, so the tool can be made to work reliably in an autonomous way) of the total analysis, and multiple tailored routines may be used in combination to produce a complete analysis. For example, a first CGCFD routine may be tailored for use with different raised floor configurations to determine the output airflow at each perforated floor tile of a raised floor in a data center, and a second CGCFD routine may be tailored for use with a cluster of racks that include two rows of racks with a cold aisle between the rows. The first CGCFD routine may be run to determine the output air at perforated tiles in the cold aisle of the rack cluster, and the second CGCFD routine may use the results of the first routine to determine the airflows and temperatures at inlets and outlets of the racks. The second routine may be run a number of times to account for all of the clusters of racks located in a data center. As equipment is moved, and as different configurations are established within a cluster to optimize cooling performance, the second routine may be run to obtain new cooling data without the need to repeat the first routine, as the airflows from the perforated tiles generally would not change. In some cases, for perforated floor tiles having a large percentage of open area (for example, greater than 50%), it may be desirable to repeat the first routine as air flows may change based on room configuration.

Embodiments of the invention that utilize the CGCFD approach to conduct the analyses of a data center provide advantages over embodiments that utilize a traditional CFD approach. These advantages include computational efficiency and simplification of use. Iterations of cooling calculations using the CGCFD approach may be conducted in a matter of seconds or minutes versus hours or days with a full CFD analysis. Further, the CGCFD routines may be designed to operate with a limited set of input variables, allowing a less-skilled user to conduct analyses using the CGCFD approach. For example, for a CGCFD routine that is tailored to analyze only the raised floor plenum, the input variables may be limited to the height of the floor, location and type of perforated tiles, length and width of the floor, and the locations and characteristics of air conditioning units that provide cooling air to the raised floor. For a CGCFD routine that is tailored to conduct an analysis on a cluster of racks, the input data may be limited to airflow per tile (could be obtained automatically from the output of a separate CGCFD routine or using other methods), the number of racks in the cluster, the power draw of each of the racks, and room height including whether the room includes an air plenum dropped ceiling. The output data for a cluster of racks may include the input temperature at each server, or other piece of equipment in a rack. In other embodiments, the output data may simply be a measure of the amount of warm recirculated air drawn into each rack. The data may be expressed as an absolute number (e.g. in terms of cfm) or expressed as a fraction of the total air consumed by the rack. A system, such as system 200 described above, may use the output data to determine if the cooling performance of the cluster is satisfactory.

In another embodiment, another improved technique for conducting the cooling analysis is used. The improved technique is referred to herein as a control volume analysis or simply CVA. The control volume analysis may be used in conjunction with a CFD analysis and/or a CGCFD analysis, or may be used as a stand alone process. The CVA technique is similar in some aspects to the CGCFD technique described above, however, further simplification of the analysis process is provided. As will be discussed below, the CVA technique is a computationally efficient technique that is particularly effective for computing the three-dimensional airflow, pressure and temperature distributions in the cold aisle of a raised floor data center. However, the CVA technique is not limited in its use to this application and may be used for other applications as well. The CVA technique can provide output data in essentially real-time, allowing a user to try various locations for equipment as part of an initial design or a retrofit and obtain cooling data for the different locations in real-time.

The CVA technique will be described with reference to FIG. 8, which shows a subsection 700 of a data center. The subsection of the data center includes a cluster of racks that includes a first row of racks 702, and a second row of racks 704, which are located on a raised floor and separated by two rows of perforated tiles 706, 708.

Figure 8:
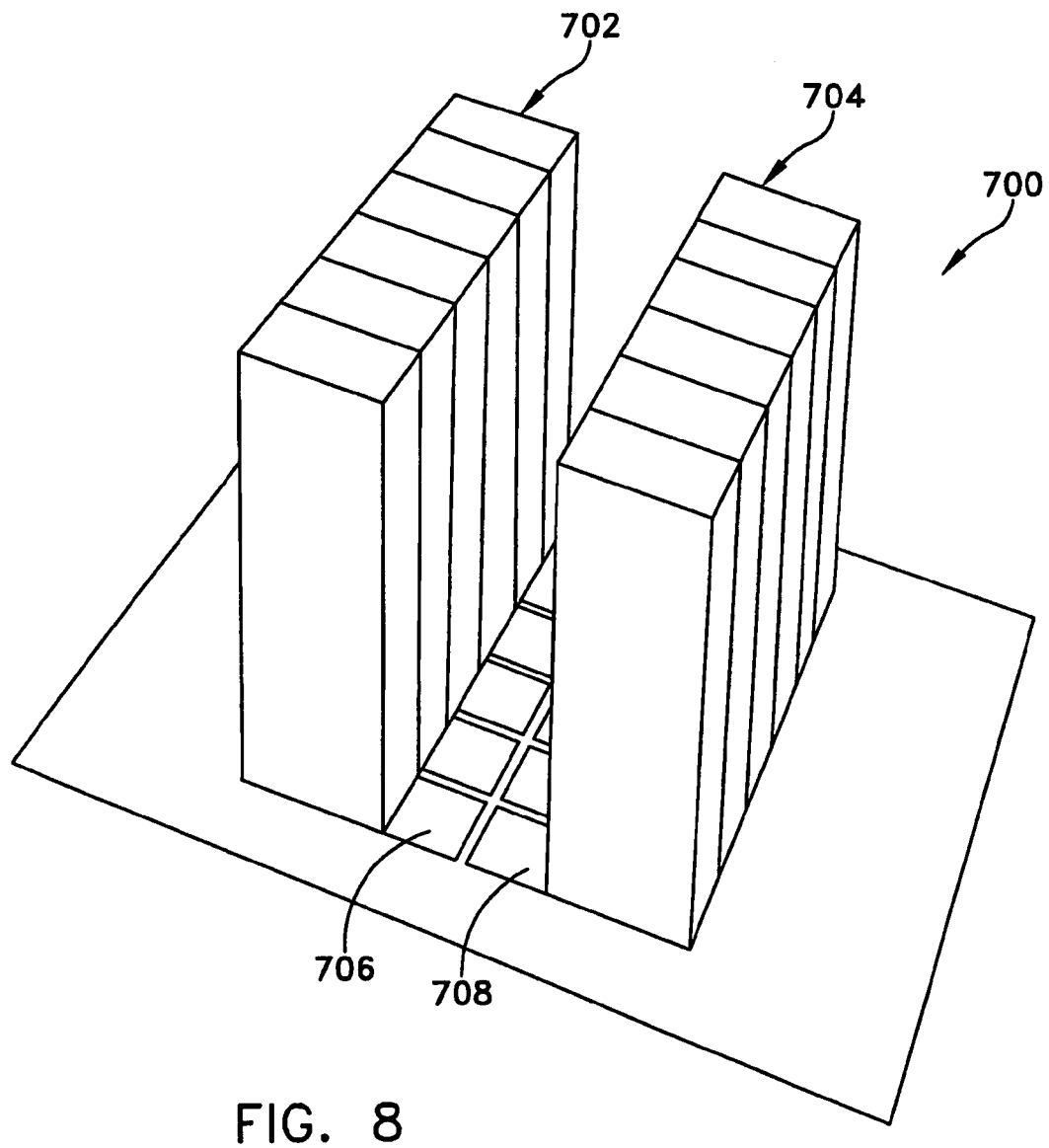
FIG. 8 shows a perspective view of a cluster of racks whose cooling performance can be analyzed using embodiments of the invention.

In data centers that have clusters of racks arranged like those in FIG. 8, it is not uncommon for undesirable hot spots to develop even though the total supply of cool air to the cluster should be sufficient to meet the needs of the racks. For example, if the airflow rate through one or more perforated tiles is too great, a rack may be unable to capture all of the tile airflow and some of the cooling air may escape the cold aisle. Racks will generally draw their required air, and in this situation, if a rack can not capture cool air, it may draw hot exhaust air over the top of the rack creating a hot spot. Further, due to widely varying cooling airflow requirements, racks may compete with one another for cooling airflow. In particular, a high-power rack may borrow underutilized air from an adjacent rack, or in some cases from a rack separated by several tiles. With several racks contained in a cluster, with each having different cooling needs, the airflow patterns and temperature distribution in the cold aisle are complex functions. The CVA technique can be used to simplify the solutions to these complex functions.

In the CVA analysis for the rack cluster of FIG. 8, the airflow and temperature analysis is conducted on the volume of air contained in the cold aisle, between the racks, from the perforated tiles up to a height equal to the top height of the racks. The volume of air is divided into a number of control volumes equal to the number of racks in the cluster. Each control volume is defined as the volume above one of the perforated tiles extending from the perforated tile to the top of the racks. The control volume analysis includes determining for each control volume, the airflow through each of the six faces of the control volume. Once the airflows are known, temperatures and mass species concentrations can be determined for each of the control volumes. In the CVA technique, the temperature analysis can be decoupled from the airflow analysis because, as discussed above, buoyancy forces in the control volumes can be ignored. Similarly, mass species concentrations are not coupled to the airflow solution and may also be computed separately if desired.

In conducting a CVA analysis in the embodiment described herein, there are several initial assumptions made to simplify the analysis. In other embodiments, the analysis could be changed if these assumptions would not apply. The first assumption is that airflow out of each face of a control volume (and therefore into the front face of a rack) is considered uniform. Resulting airflow and temperature values effectively represent an average of the airflow and temperature at each face.

The second assumption is that buoyancy forces within each control volume are negligible. Unless a significant hot spot develops, then there is insufficient heating of the air in a cold aisle to substantially affect airflow patterns, and even if some heating occurs, any buoyancy effects are small compared to the momentum of the airflow from typical perforated tiles.

The third initial assumption is that viscosity and turbulence within each control volume are negligible. In the control volumes, air is introduced through the perforated tiles and is pulled into the racks. The air is not required to change direction rapidly and there is no flow of air parallel to solid objects. Accordingly, viscosity and turbulence may be ignored and the competition of forces driving the airflow reduces to an interplay between pressure and momentum.

Figure 9:
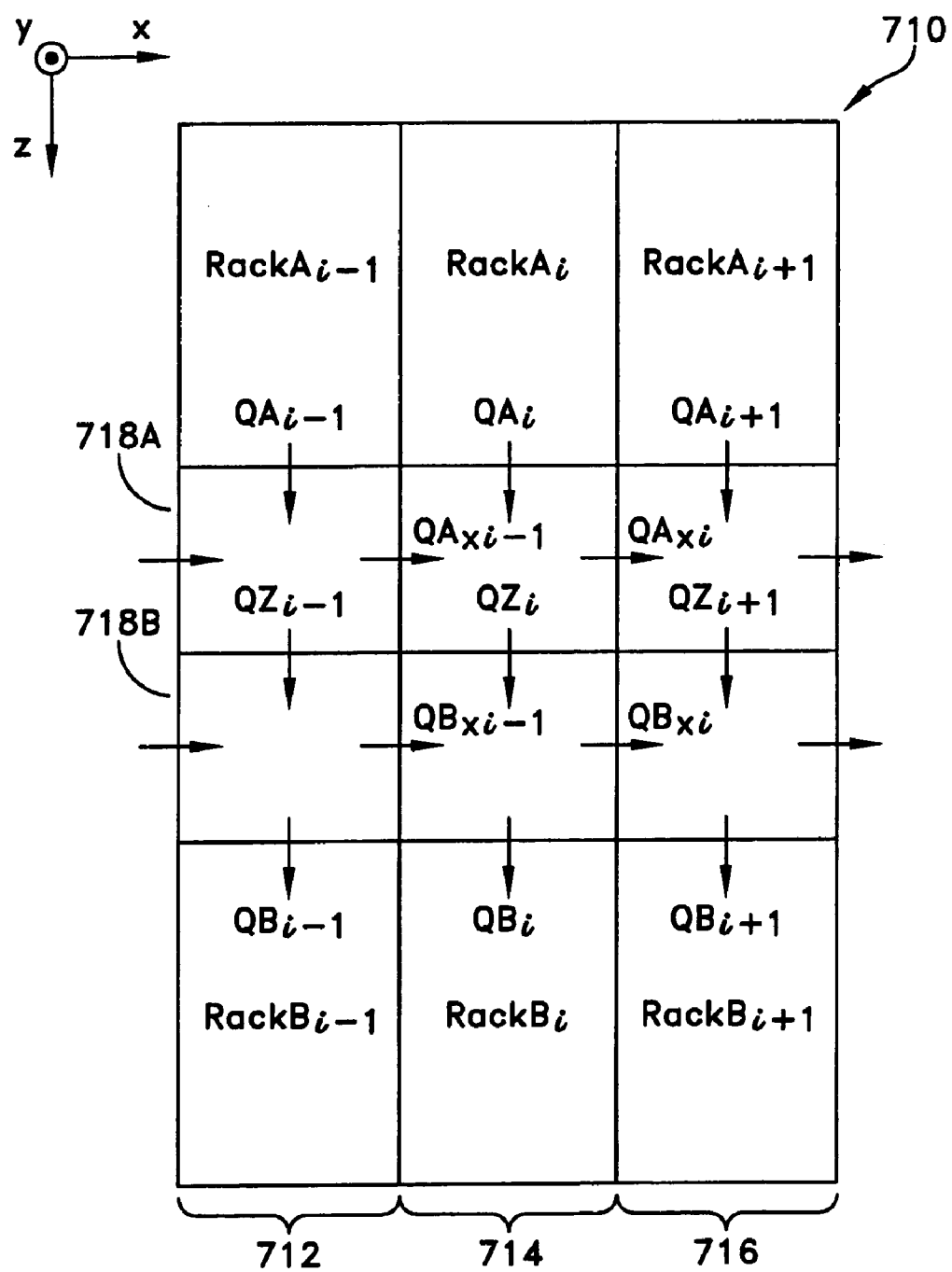
FIG. 9 shows a top view of a cluster of racks whose cooling performance can be analyzed using a control volume analysis technique of at least one embodiment.

The CVA analysis may be further simplified by dividing a cluster of racks into slices of two racks separated by two perforated tiles 718A, 718B. FIG. 9 shows a cluster of six racks 710 that can be divided into three two-rack slices 712, 714, 716. The nomenclature used for identifying racks, and airflows in FIG. 9 is defined in Table 1 below, along with other variables that will be used herein in the description of the CVA technique.

TABLE 1

| | |
|---|---|
| $A_s, A_t$ | Control volume side and perforated tile area |
| $C_1, C_2$ | Dimensionless empirical constants in the y and x-momentum equations |
| C | Species Concentration |
| CV | Control volume |
| N | Number of 2-rack slices in cluster |
| $\hat{n}$ | Outward unit normal vector |
| $PA_i, PB_i$ | Pressure in control volume above perforated tiles $A_i$ and $B_i$ |
| $P_{amb}$ | Ambient reference pressure |
| $M_L, M_R, M_T$ | z-direction momentum flux terms through left, right, and top surfaces of staggered CV at slice i |
| $TA_i, TB_i$ | Temperature in control volume above perforated tiles $A_i$ and $B_i$ |
| $Q_t$ | Airflow rate through each perforated tile |
| $QA_i, QB_i$ | Airflow rate through racks $A_i$ and $B_i$ |
| $QAx_i, QBx_i$ | Airflow rates in the x-direction above perforated tiles $A_i$ and $B_i$ |
| $Qz_i$ | Airflow rates in the z-direction above perforated tiles between tiles $A_i$ and $B_i$ |
| $QAtop_i, QBtop_i$ | Airflow rates in the y-direction above perforated tiles $A_i$ and $B_i$ at top-of-rack height |
| $\vec{V}$ | Velocity Vector |
| $\alpha$ | Linear relaxation factor |
| $\rho$ | Density of air |

At the start of the CVA analysis, the rack airflows $QA_i$, $QB_i$ and the tile airflows are known. The tile airflows can be estimated based on the mean perforated tile airflow for the entire facility or determined using a CFD analysis, a CGCFD analysis, physical measurement, or using one of a number of known programs. The rack airflows can be determined based on characteristics of equipment installed in the rack. In one embodiment, each rack airflow is determined on the basis of the power usage of the rack and using the relationship of 160 cfm per kilowatt of power as discussed above. To determine the airflow patterns, all airflows $QAx_i$, $QBx_i$, $Qz_i$, $QAtop_i$, and $QBtop_i$, and pressures $PA_i$, and $PB_i$ are computed based on the principle of conservation of mass and momentum. To perform this computation, a total of 7n−2 unknowns may be determined using a total of 7n−2 equations, where n is the number of 2-rack slices (or length of cluster expressed in tile or rack widths). Optionally, an energy balance or mass species balance can then be used to compute the 2n temperatures based on the airflows.

In one embodiment, rather than solve all equations simultaneously, a semi-simultaneous approach is taken. In this embodiment, the five unknowns for each two-rack slices of a rack cluster, airflows $Qz_i$, $QAtop_i$, and $QBtop_i$, and pressures $PA_i$, and $PB_i$, are first determined simultaneously. During these initial computations, each two-rack slice is considered in isolation, which is the equivalent of having the ends of the slices blocked, such that $QAx_i$ and $QBx_i$ are equal to zero. After an initial sweep through each two-rack slice is complete, the side-to-side airflows ($QAx_i$, $QBx_i$,) can be computed based on the calculated pressures within each control volume. The side-to-side airflows affect the pressures, and after computing the side to side airflows, a second computation of the airflows and pressures is conducted for each of the two-rack slices. This process is repeated until there are no significant changes in the computed variables. Once all airflows are known, all temperatures or mass species concentrations can be computed directly without the need to do multiple iterations.

The fundamental equations used to compute the unknowns described above, assuming steady state, incompressible and inviscid fluid flow rely on conservation of mass (m), conservation of momentum (M) conservation of energy (e) and conservation of species concentration (C), and can be written as follows:

$$\int_A (\vec{V} \cdot \hat{n}) dA = 0 \quad \text{(m)}$$

$$\int_A (\rho \vec{V} \cdot \hat{n}) \vec{V} dA = - \int_A p \hat{n} dA \quad \text{(M)}$$

$$\int_A T(\vec{V} \cdot \hat{n}) dA = 0 \quad \text{(e)}$$

$$\int_A C(\vec{V} \cdot \hat{n}) dA = 0 \quad \text{(C)}$$

Applying the conservation of mass equation (m) to the two-rack slices for the conditions described above results in the following equations:

$$Q_t + QA_i + QAx_{i-1} = Qz_i + QAx_i + QAtop_i \quad (1)$$

$$Q_t + Qz_i + QBx_{i-1} = QB_i + QBx_i + QBtop_i \quad (2)$$

Where $QA_i$ is always negative based on the sign convention of FIG. 9.

Figure 9A:
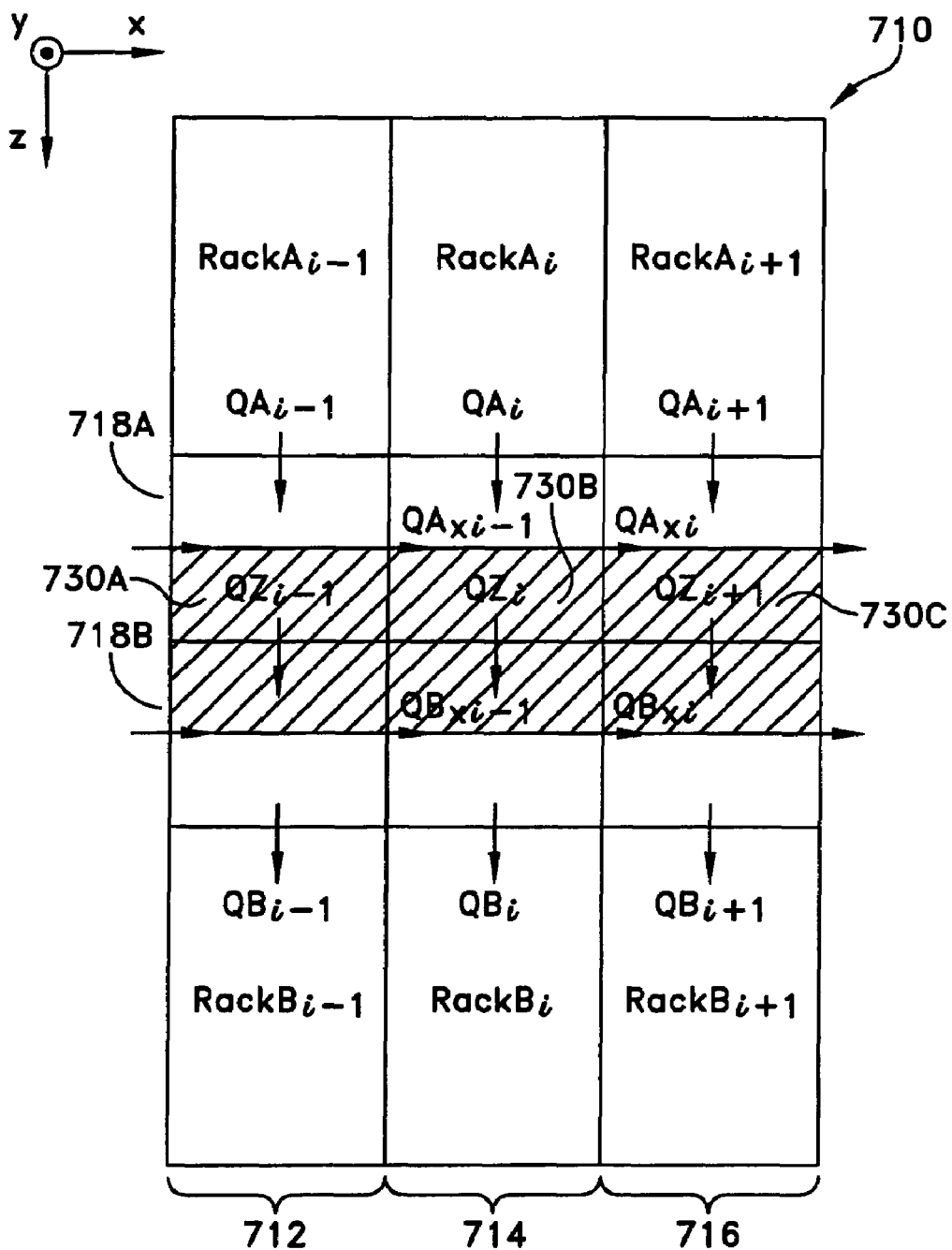
FIG. 9A shows the cluster of racks of FIG. 9 along with staggered control volumes that may be used in the control volume analysis technique.

As will now be described, staggered control volumes are used to formulate the z-momentum equations. Three staggered control volumes 730A, 730B and 730C are shown in FIG. 9A. The number of staggered control volumes is equal to the number of 2-rack slices. The staggered control volumes are the same size as the main control volumes, but are shifted so that they are located midway between opposing racks. The staggered control volumes allow pressure to be considered more easily for each face which is normal to the z-direction. If the original control volumes are used, then each control volume would have one face coplanar with a rack inlet, which is a face over which the pressure is not known and need not be known in the calculations. Applying the conservation of momentum equation (M) in the z-direction to the staggered control volume in slice i results in the following equation:

$$PA_i - PB_i = (\rho/(4A_s^2))\{(Qz_i + QB_i)^2 - (QA_i + QZ_i)^2\} + M_L + M_R + M_T \quad (3)$$

In equation (3), the first term on the right hand side of equation (3) is generally dominant, as it accounts for the effect of rack airflow rates on control volume pressures. $M_L$, $M_R$ and $M_T$ account for losses or gains in z-momentum through the sides and the top of the control volume.

Using an "upwind" estimate for incoming/outgoing z-momentum and assuming that the velocity of the air in the z-direction is negligible above the racks, $M_L$, $M_R$ and $M_T$ are determined using the equations of Table 2 below

TABLE 2

| IF | THEN | ELSE |
|---|---|---|
| $QAx_{i-1} + QBx_{i-1} \geq 0$ | $M_L = -(\rho/(2A_s^2))(QAx_{i-1} + QBx_{i-1})Qz_{i-1}$ | $M_L = -(\rho/(2A_s^2))(QAx_{i-1} + QBx_{i-1})Qz_i$ |
| $QAx_i + QBx_i \geq 0$ | $M_R = (\rho/(2A_s^2))(QAx_i + QBx_i)Qz_i$ | $M_R = (\rho/(2A_s^2))(QAx_i + QBx_i)Qz_{i+1}$ |
| $QAtop_i + QBtop_i \geq 0$ | $M_T = (\rho/(4A_s^2))(QAtop_i + QBtop_i)Qz_i$ | $M_T = 0$ |

The relationship between Y-momentum and pressure may be written using equations (4) and (5) as follows:

$$PA_i - P_{amb} = (\rho/A_t^2)\{C1[Q_t + \tfrac{1}{2}(QAi + QAx_{i-1} - QAx_i - Qz_i)]^2 - \tfrac{1}{2}QAtop_i^2\} \quad (4)$$

$$PB_i - P_{amb} = (\rho/A_t^2)\{C1[Q_t + \tfrac{1}{2}(Qzi + QBx_{i-1} - QBx_i - QB_i)]^2 - \tfrac{1}{2}QBtop_i^2\} \quad (5)$$

Figure 10:
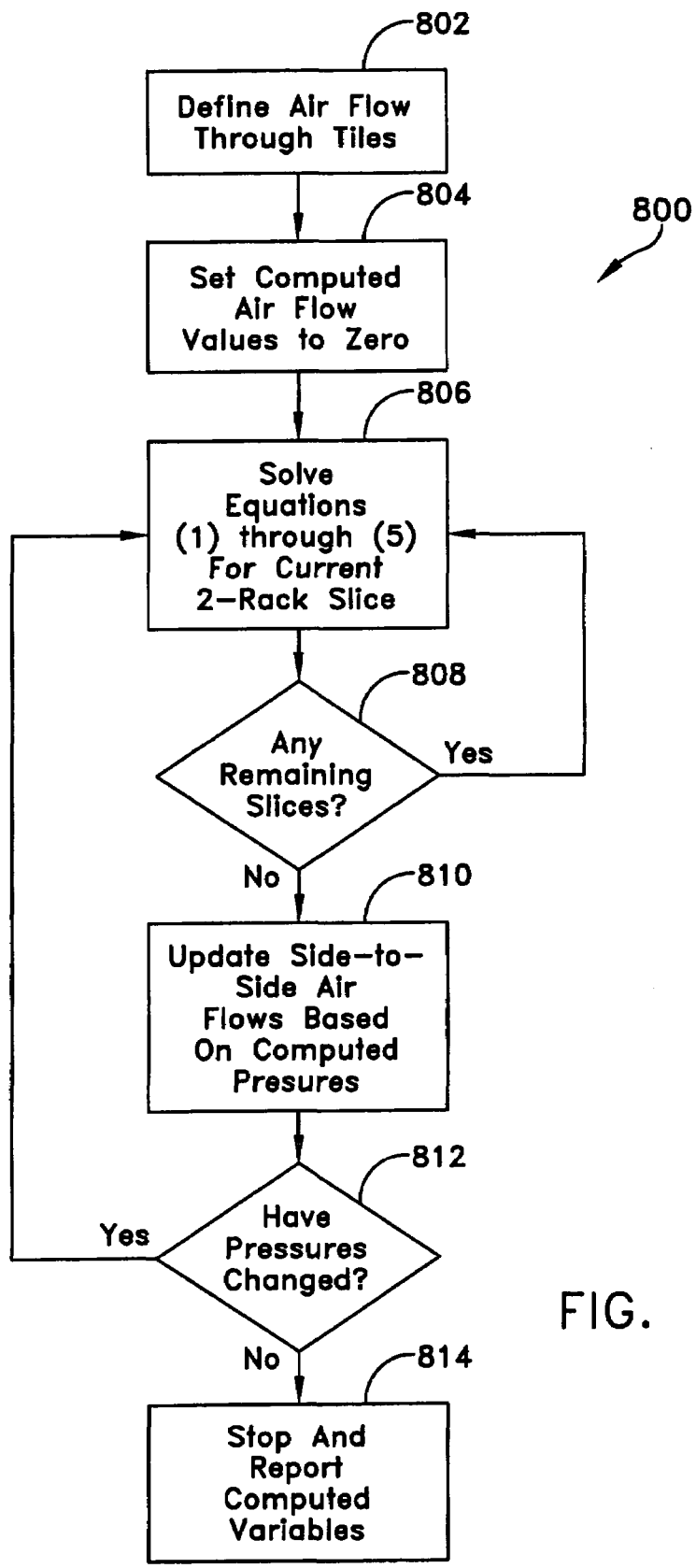
FIG. 10 is a flow chart of a control volume analysis technique in accordance with one embodiment of the invention.

In one embodiment, equations (1) through (5) are solved simultaneously for each 2-rack slice of a rack cluster sequentially using the process 800 shown in FIG. 10. In the first stage 802 of process 800, the user defines $Q_T$ (the airflow through the perforated tiles), the number of 2-rack slices in the cluster, and the power draw of each of the racks. As discussed above, $Q_T$ may be estimated as the mean perforated tile airflow rate for the entire facility or determined separately using, for example, a CFD or CGCFD analysis or other analysis or physical measurement. At stage 804, all airflow variables (except $Q_T$ and the rack inlet airflows) are initialized to zero. At stage 806, equations (1) through (5) are solved simultaneously for each slice. At decision block 808 a determination is made as to whether the equations have been solved for all slices, and if not, stage 806 is repeated. Once the equations have been solved for all slices, then at stage 810, the x-direction airflow variables are updated based on the computed pressures in the control volumes, $PA_i$ and $PB_i$ as discussed below. At stage 812, a determination is made as to whether the computed pressures have changed by more than a predetermined threshold since the previous iteration and if so, stages 806 to 812 are repeated. Once there is no significant change in the computed variables, the process 800 stops at stage 814, at which point the pressures and airflows for all of the control spaces have been determined.

In the process 800, at stage 810, new x-direction airflow values ($QA_{xi}$ and $QB_{xi}$) are determined based on the assumption that the pressure drop between adjacent cells is proportional to the square of the airflow rate using the equations in Table 3.

TABLE 3

| IF | THEN | ELSE |
|---|---|---|
| $PA_i \geq PA_{i+1}$ | $QAx_i = A_s\{(PA_i - PA_{i+1})/(\rho C_2)\}^{1/2}$ | $QAx_i = -A_s\{(PA_{i+1} - PA_i)/(\rho C_2)\}^{1/2}$ |
| $PB_i \geq PB_{i+1}$ | $QBx_i = A_s\{(PB_i - PB_{i+1})/(\rho C_2)\}^{1/2}$ | $QBx_i = -A_s\{(PB_{i+1} - PB_i)/(\rho C_2)\}^{1/2}$ |

In one embodiment, because of non-linearities of the equations, adjustments to the x-direction airflow values at stage 810 are achieved gradually by introducing damping into the iterative process and updating the values of $QAx_i$ and $QBx_i$ using the following equations (6) and (7).

$$QAx_i = \alpha QAx_i^{new} + (1-\alpha)QAx_i^{old} \quad (6)$$

$$QBx_i = \alpha QBx_i^{new} + (1-\alpha)QBx_i^{old} \quad (7)$$

In equations (6) and (7), $\alpha$ is a linear relaxation factor. If $\alpha$ is set to zero, then no changes will occur from iteration to iteration. If $\alpha$ is set to 1, then there will be no damping introduced. For smaller values of $\alpha$, more iterations will be required, however, the chances of obtaining a stable solution increase. The particular optimum choice of $\alpha$ is problem specific, however, it has been found that values of $\alpha$ around 0.05 work well in the process described above. Once the airflows are computed using the process above, temperatures and mass species concentrations can be calculated, if desired. It should be noted that control volumes may be used to compute temperatures or concentrations regardless of the method used to initially compute airflows.

The CVA technique described above can be conducted separately, one for each cluster of racks in a facility to obtain a complete cooling analysis of the facility. When a retrofit of a facility is to be done, the control volume analysis may be done for all clusters, or only for those in the vicinity of any changes to the facility.

Three different methods, CFD, CGCFD and CVA, have been described above for determining cooling data in embodiments of the present invention to determine placement of location of equipment in data centers. In still another embodiment, empirical rules are used either alone or in combination with one of the methods described above to determine proper placement of equipment and the adequacy of cooling air. The empirical rules that are used may take a number of different forms, and programs incorporating the empirical rules may be updated as more data is generated to support the empirical rules. In one embodiment, empirical rules are based, at least in part, on the ability of equipment racks to borrow unused capacity from surrounding neighbors. The amount that may be borrowed may be limited to an allowable fraction (or weight) of the unused capacity and the particular allowable fraction may differ depending on a number of variables such as borrower-donor separation distance, tile flow rate, and the total power draw of both the borrower and the donor.

In one particular embodiment, the cooling air available to a given rack is computed based on a weighted summation of the available airflows from airflow sources (i.e., supply devices or vents), net of airflows computed to be used by other racks, where the weights associated with the available airflows for a given rack decrease with distance between the rack and the air supply devices or vents. For example, with reference to FIG. 9, the cooling air available to each rack may initially be set equal to the cooling air supplied by the perforated tile in front of the rack, or to reflect possible losses, and provide safety margin, the cooling air available may be set equal to some amount (i.e. 90%) of the total air from the perforated tile. The cooling load for each rack is then subtracted from the available air to provide a net available cooling air figure for each perforated tile and to provide an initial indication of a lack of cooling air for any equipment rack. For each equipment rack, the available cooling air is then increased by assigning to each rack, a percentage of the net available cooling air from nearby perforated tiles. For example, the cooling air available may include 10% of the net available cooling air from a perforated tile associated with either an adjacent rack or a rack across an aisle, and 5% of the net available cooling air from a perforated tile of a diagonal rack or a rack two positions over in a row. The particular percentages or weights used may be changed based on actual results or as a result of analyses conducted. The loads of each rack may then be compared with the total available cooling air to determine remaining cooling capacity and to identify any potential problem racks.

In at least one embodiment, empirical rules may be used in combination with superposition to analyze data centers and provide recommended equipment layouts. Using superposition, complex problems may be broken down into simpler problems that can then be solved using empirical rules.

In one embodiment, empirical rules are established by initially performing a number of CFD analyses on typical rack layouts, and the results of these analyses are used to produce simple equations or look-up tables that can be used in real-time to design layouts of equipment. In such an analysis, the side-to-side airflows, such as those shown in FIG. 9 may be determined for each rack one at a time with one rack turned "on" and all other racks turned "off". The airflows at the ends of a cluster for a number of different configurations may also be determined using CFD. The airflows may be determined for a number of different air intake values for each rack and a number of different values of air flow from the perforated tiles. The total air flows for different configurations can then be determined in real-time using superposition and the stored results. The airflows through the top (in or out) of the volume in front of each rack may then be determined based on conservation of mass. In one embodiment, when the airflow into the top of one of the volumes exceeds some percentage (i.e., 20%) of the total air flow into the rack associated with the volume, then an overheating problem may exist requiring a design around. In other embodiments, mass species concentration analyses may be used in combination with empirical rules to determine what percentage of the total air entering a control volume is recirculated air to determine when an overheating problem may exist.

In determining the airflows for each rack of a cluster, symmetry of the clusters can be used to reduce the number of CFD analyses that need to be performed, and the control volumes discussed above with respect to FIG. 9 may be used to establish a reference grid for the analysis. For example, with reference to the cluster of racks 710 of FIG. 9, CFD analyses need only be performed for Rack $A_{i-1}$ and Rack $A_i$, and the results for each other rack may be determined based on the resulting airflows and the relative position of the racks. For example, the airflows in the cluster associated with Rack $B_{i+1}$ are the same as those associated with Rack $A_{i-1}$ with the direction of some of the airflows changed for corresponding Rack A and Rack B inlet airflow and tile airflow rates.

In addition to the cooling analysis methods discussed above, which provide real-time analysis of data centers, additional cooling analysis methods may be used in embodiments of the invention. These additional methods include a panel method, a potential analysis method, flow network/zonal modeling, principal component analysis or a combination of any of these and the methods discussed above. These additional cooling analysis methods are generally known to those of skill in the art.

Various embodiments according to the invention may be implemented on one or more computer systems as discussed above. For example, system 200 may be implemented in a single computer system or in multiple computer systems. These computer systems may be, for example, general-purpose computers such as those based on Intel PENTIUM-type processor, Motorola PowerPC, Sun UltraSPARC, Hewlett-Packard PA-RISC processors, or any other type of processor.

Figure 11:
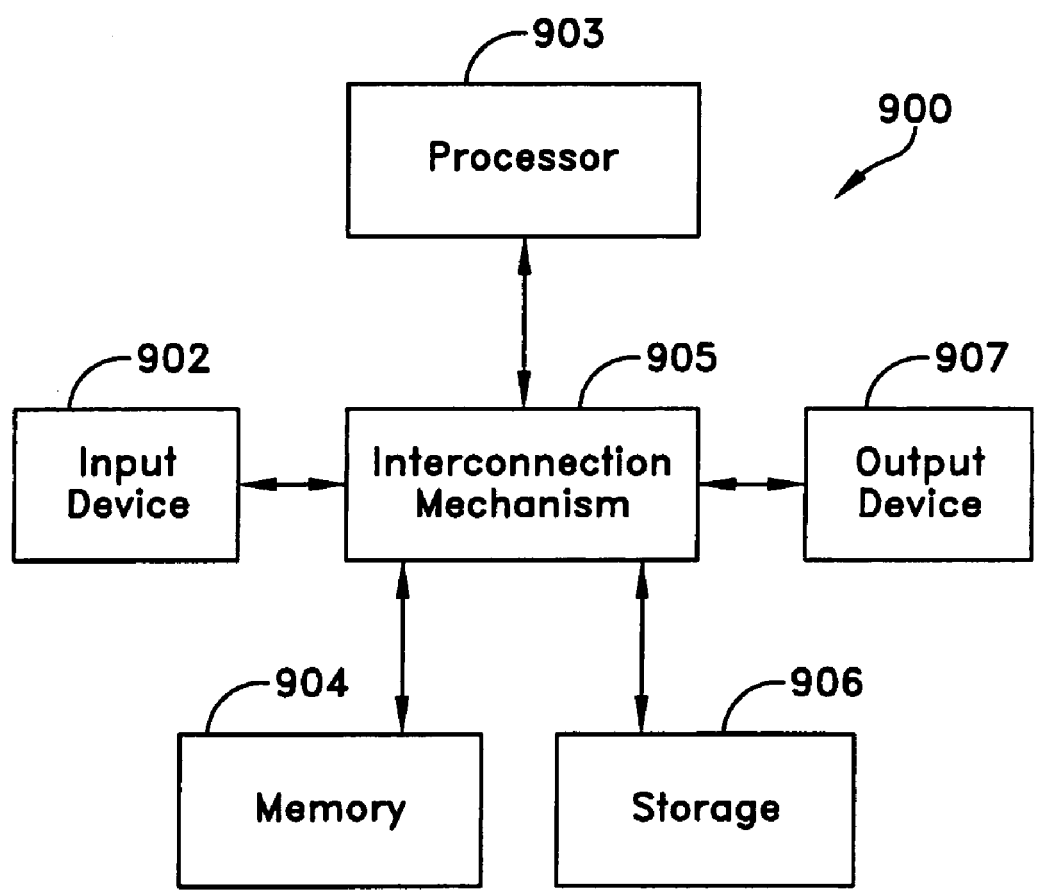
FIG. 11 is a functional block diagram of a computer system that may be used in embodiments of the invention.

For example, various aspects of the invention may be implemented as specialized software executing in a general-purpose computer system 900 such as that shown in FIG. 11. The computer system 900 may include a processor 903 connected to one or more memory devices 904, such as a disk drive, memory, or other device for storing data. Memory 904 is typically used for storing programs and data during operation of the computer system 900. The computer system 900 may also include a storage system 906 that provides additional storage capacity. Components of computer system 900 may be coupled by an interconnection mechanism 905, which may include one or more busses (e.g., between components that are integrated within a same machine) and/or a network (e.g., between components that reside on separate discrete machines). The interconnection mechanism 905 enables communications (e.g., data, instructions) to be exchanged between system components of system 900.

Computer system 900 also includes one or more input devices 902, for example, a keyboard, mouse, trackball, microphone, touch screen, and one or more output devices 907, for example, a printing device, display screen, speaker. In addition, computer system 900 may contain one or more interfaces (not shown) that connect computer system 900 to a communication network (in addition or as an alternative to the interconnection mechanism 905.

Figure 12:
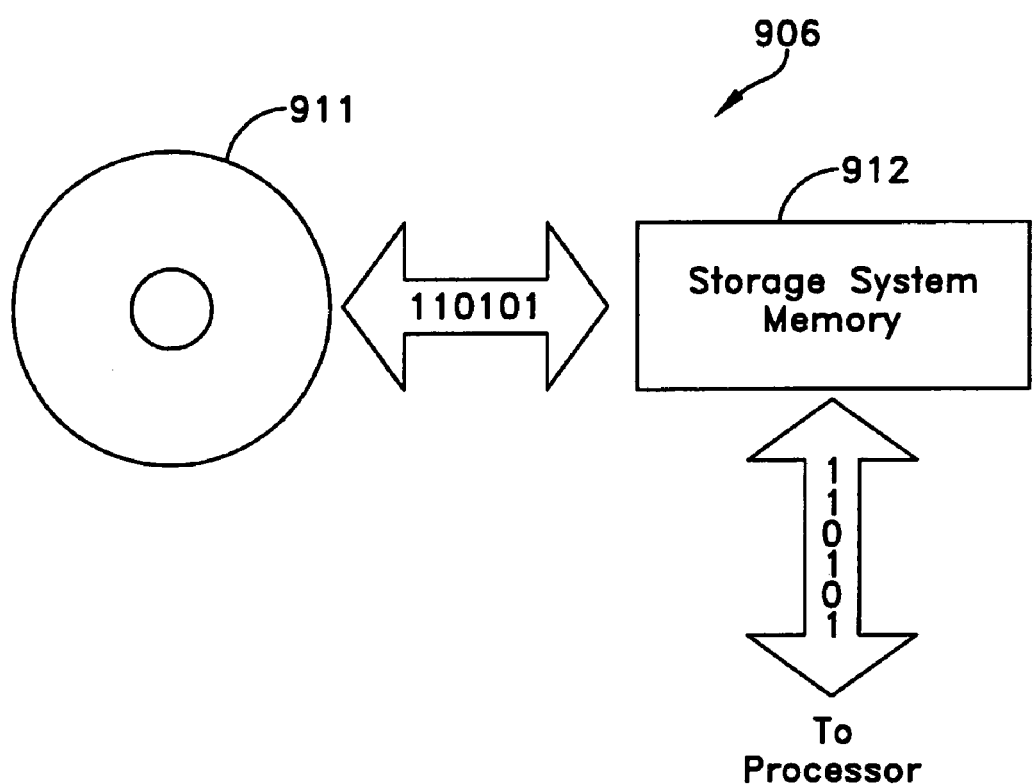
FIG. 12 is a functional block diagram of a storage system that may be used with the computer system of FIG. 11.

The storage system 906, shown in greater detail in FIG. 12, typically includes a computer readable and writeable nonvolatile recording medium 911 in which signals are stored that define a program to be executed by the processor or information stored on or in the medium 911 to be processed by the program. The medium may, for example, be a disk or flash memory. Typically, in operation, the processor causes data to be read from the nonvolatile recording medium 911 into another memory 912 that allows for faster access to the information by the processor than does the medium 911. This memory 912 is typically a volatile, random access memory such as a dynamic random access memory (DRAM) or static memory (SRAM). It may be located in storage system 906, as shown, or in memory system 904. The processor 903 generally manipulates the data within the integrated circuit memory 904, 912 and then copies the data to the medium 911 after processing is completed. A variety of mechanisms are known for managing data movement between the medium 911 and the integrated circuit memory element 904, 912, and the invention is not limited thereto. The invention is not limited to a particular memory system 904 or storage system 906.

The computer system may include specially-programmed, special-purpose hardware, for example, an application-specific integrated circuit (ASIC). Aspects of the invention may be implemented in software, hardware or firmware, or any combination thereof. Further, such methods, acts, systems, system elements and components thereof may be implemented as part of the computer system described above or as an independent component.

Although computer system 900 is shown by way of example as one type of computer system upon which various aspects of the invention may be practiced, it should be appreciated that aspects of the invention are not limited to being implemented on the computer system as shown in FIG. 11. Various aspects of the invention may be practiced on one or more computers having a different architecture or components shown in FIG. 11.

Computer system 900 may be a general-purpose computer system that is programmable using a high-level computer programming language. Computer system 900 may be also implemented using specially programmed, special purpose hardware. In computer system 900, processor 903 is typically a commercially available processor such as the well-known Pentium class processor available from the Intel Corporation. Many other processors are available. Such a processor usually executes an operating system which may be, for example, the Windows 95, Windows 98, Windows NT, Windows 2000 (Windows ME) or Windows XP operating systems available from the Microsoft Corporation, MAC OS System X operating system available from Apple Computer, the Solaris operating system available from Sun Microsystems, or UNIX operating systems available from various sources. Many other operating systems may be used.

The processor and operating system together define a computer platform for which application programs in high-level programming languages are written. It should be understood that embodiments of the invention are not limited to a particular computer system platform, processor, operating system, or network. Also, it should be apparent to those skilled in the art that the present invention is not limited to a specific programming language or computer system. Further, it should be appreciated that other appropriate programming languages and other appropriate computer systems could also be used.

One or more portions of the computer system may be distributed across one or more computer systems coupled to a communications network. For example, as discussed above, a computer system that performs build-out functions may be located remotely from a system manager. These computer systems also may be general-purpose computer systems. For example, various aspects of the invention may be distributed among one or more computer systems configured to provide a service (e.g., servers) to one or more client computers, or to perform an overall task as part of a distributed system. For example, various aspects of the invention may be performed on a client-server or multi-tier system that includes components distributed among one or more server systems that perform various functions according to various embodiments of the invention. These components may be executable, intermediate (e.g., IL) or interpreted (e.g., Java) code which communicate over a communication network (e.g., the Internet) using a communication protocol (e.g., TCP/IP).

It should be appreciated that the invention is not limited to executing on any particular system or group of systems. Also, it should be appreciated that the invention is not limited to any particular distributed architecture, network, or communication protocol.

Various embodiments of the present invention may be programmed using an object-oriented programming language, such as SmallTalk, Java, C++, Ada, or C# (C-Sharp). Other object-oriented programming languages may also be used. Alternatively, functional, scripting, and/or logical programming languages may be used. Various aspects of the invention may be implemented in a non-programmed environment (e.g., documents created in HTML, XML or other format that, when viewed in a window of a browser program, render aspects of a graphical-user interface (GUI) or perform other functions). Various aspects of the invention may be implemented as programmed or non-programmed elements, or any combination thereof.

In embodiments of the invention discussed above, systems and methods are described that provide indications of remaining cooling capacity for equipment enclosures. The indication of remaining cooling capacity may be a direct indication of remaining cooling in terms of, for example, kilowatts or BTU, or the indication may be indirect such as providing the total capacity of cooling available to an enclosure along with an indication of how much cooling is being used, for example, in terms of percentage.

Embodiments of a systems and methods described above are generally described for use in relatively large data centers having numerous equipment racks, however, embodiments of the invention may also be used with smaller data centers and with facilities other than data centers. Further, as discussed above, embodiments of the present invention may be used with facilities having raised floors as well as with facilities that do not have a raised floor.

In embodiments of the present invention discussed above, results of analyses are described as being provided in real-time. As understood by those skilled in the art, the use of the term real-time is not meant to suggest that the results are available immediately, but rather, are available quickly giving a designer the ability to try a number of different designs over a short period of time, such as a matter of minutes.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method for analyzing cooling capacity using a computer system, the computer system including a display, a data storage medium and a controller coupled to the display and the data storage medium, the method comprising:
    determining, by the controller, cooling capacity for each of a number of equipment enclosures in a data center based on local air flow characteristics of a proposed location for each equipment enclosure in the data center;
    determining, by the controller, cooling requirements of each of the number of equipment enclosures; and
    providing, by the controller in the display, an amount of remaining cooling capacity for each of the number of equipment enclosures.

2. The method of claim 1, further comprising:
    developing a floor plan model of the data center, wherein the floor plan model includes a floor plan that indicates location of each of the number of equipment enclosures in the data center; and
    for each of the number of equipment enclosures, displaying on the floor plan, the amount of remaining cooling capacity.

3. The method of claim 2, wherein the amount of remaining cooling capacity includes an amount of additional power that can be drawn by each of the number of equipment enclosures based on the remaining cooling capacity.

4. The method of claim 2, wherein determining, by the controller, cooling capacity includes calculating a predicted cooling capacity based on the floor plan model.

5. The method of claim 4, wherein determining, by the controller, cooling capacity includes measuring airflow at a first plurality of locations in the facility to obtain a measured cooling capacity.

6. The method of claim 5, wherein determining, by the controller, cooling capacity includes measuring air temperature at a second plurality of locations in the facility.

7. The method of claim 6, wherein at least one of the first plurality of locations and the second plurality of locations includes at least one air vent of a raised floor.

8. The method of claim 5, further comprising comparing predicted cooling capacity with measured cooling capacity to obtain a comparison result and providing an indication when the comparison result is greater than a threshold.

9. The method of claim 8, further comprising adjusting the predicted cooling capacity based on measured airflow.

10. The method of claim 9, further comprising determining placement of new equipment in an equipment enclosure in the data center by comparing power ratings of the new equipment with cooling capacity of the equipment enclosure.

11. The method of claim 10, further comprising for each of the number of equipment enclosures, determining electrical power capacity and remaining electrical power availability.

12. The method of claim 11, wherein determining remaining electrical power availability includes measuring at least one parameter of electrical power provided to at least one of the number of equipment enclosures.

13. The method of claim 12, further comprising for each of the number of equipment enclosures, displaying on the floor plan the remaining electrical power availability.

14. The method of claim 11, further comprising displaying for each of the plurality of equipment enclosures electrical power capacity, remaining electrical power availability, cooling capacity, and remaining cooling capacity.

15. The method of claim 1, wherein determining, by the controller, cooling capacity includes measuring airflow at a first plurality of locations in the facility to obtain a measured cooling capacity.

16. The method of claim 1, wherein determining, by the controller, cooling capacity includes measuring air temperature at a second plurality of locations in the facility.

17. The method of claim 1, further comprising determining placement of new equipment in an equipment enclosure in the data center by comparing power ratings of the new equipment with cooling capacity of the equipment enclosure.

18. The method of claim 17, further comprising for each of the number of equipment enclosures, determining electrical power capacity and remaining electrical power availability.

19. The method of claim 18, wherein determining remaining electrical power availability includes measuring at least one parameter of electrical power provided to at least one of the number of equipment enclosures.

20. The method of claim 19, further comprising for each of the number of equipment enclosures, displaying on the floor plan the remaining electrical power availability.

21. The method of claim 18, further comprising displaying for each of the plurality of equipment enclosures electrical power capacity, remaining electrical power availability, cooling capacity, and remaining cooling capacity.

22. The method of claim 1, wherein determining, by the controller, cooling capacity includes defining a plurality of control volumes, such that each control volume is adjacent to one of the equipment enclosures, and wherein the method further includes determining airflow into each of the equipment enclosures by determining airflow into and out of each of a plurality of sides of each control volume.

23. The method of claim 1, wherein determining, by the controller, cooling capacity includes conducting a Coarse-Grid computational fluid dynamics analysis.

24. The method of claim 23, wherein conducting the Coarse Grid computational fluid dynamics analysis includes defining areas adjacent to each of the equipment enclosures in a grid of approximately one foot cubes and determining cooling parameters for each of the cubes.

25. The method of claim 22, wherein defining a control volume includes defining a control volume adjacent to each equipment enclosure such that a width and a height of each control volume is approximately equal to the width and height of an adjacent equipment enclosure.

26. The method of claim 1, wherein determining, by the controller, cooling capacity of an equipment enclosure includes estimating available cooling air at the equipment enclosure using a weighted summation of available airflows from a plurality of airflow sources.

27. The method of claim 26, wherein weights used in the weighted summation decrease with distance from the equipment enclosure to each of the airflow sources.

28. The method of claim 26, wherein weights used in the weighted summation are based on mechanical characteristics of the plurality of airflow sources.

29. The method of claim 26, further comprising determining available airflow of at least one of the plurality of airflow devices using at least one of specifications of the at least one of the plurality of airflow devices and measured data for the at least one of the plurality of airflow devices in the data center.

30. The method of claim 29, further comprising determining available airflow of at least a second one of the plurality of airflow devices based on the measured data for the at least one of the plurality of airflow devices.

31. The method of claim 22, wherein determining, by the controller, cooling capacity includes using superposition to combine airflows.

32. The method of claim 22, wherein determining airflow into and out of each of a plurality of sides of each control volume includes computing airflows using equations based on at least one of conservation of mass and conservation of momentum.

33. The method of claim 22, wherein determining airflow into and out of each of a plurality of sides of each control volume includes determining airflows using empirical rules.

34. A system for managing a data center, the system comprising:
at least one input to receive data related to equipment and equipment enclosures and to receive data related to cooling characteristics of the data center;
a controller operatively coupled to the input and configured to determine cooling capacity of each equipment enclosure based on air flow characteristics local to each equipment enclosure; and
at least one display operatively coupled to the controller that provides an amount of remaining cooling capacity for each of the equipment enclosures.

35. The system of claim 34, wherein the system is configured to display a floor plan of at least a portion of the data center indicating a location of at least one of the equipment enclosures in the data center and indicating the remaining cooling capacity for the at least one of the equipment enclosures.

36. The system of claim 35, wherein the display device is configured to include an indication of additional power that can be drawn by the at least one of the equipment enclosures.

37. The system of claim 36, further comprising at least one airflow monitor operatively coupled to the controller to provide data related to at least one airflow in the data center.

38. The system of claim 37, further comprising at least one air monitor operatively coupled to the controller to provide data related to air temperature at a location in the data center.

39. The system of claim 38, wherein the controller is configured to compare a predicted cooling capacity with a measured cooling capacity to obtain a comparison result and to provide an indication when the comparison result is greater than a threshold.

40. The system of claim 39, further comprising at least one power monitor operatively coupled to the controller.

41. The system of claim 40, further comprising at least one airflow controller operatively coupled to the controller and responsive to signals from the controller to alter cooling airflow in the data center.

42. The system of claim 41, further comprising at least one power controller operatively coupled to the controller and responsive to signals from the controller to alter at least one characteristic of power in the data center.

43. The system of claim 34, further comprising at least one airflow monitor operatively coupled to the controller to provide data related to at least one airflow in the data center.

44. The system of claim 34, further comprising at least one air monitor operatively coupled to the controller to provide data related to air temperature at a location in the data center.

45. The system of claim 34, wherein the controller is configured to compare a predicted cooling capacity with a measured cooling capacity to obtain a comparison result and to provide an indication when the comparison result is greater than a threshold.

46. The system of claim 34, further comprising at least one power monitor operatively coupled to the controller.

47. The system of claim 34, further comprising at least one airflow controller operatively coupled to the controller and responsive to signals from the controller to alter cooling airflow in the data center.

48. The system of claim 34, further comprising at least one power controller operatively coupled to the controller and responsive to signals from the controller to alter at least one characteristic of power in the data center.

49. The system of claim 34, wherein the controller is configured to receive data related to additional equipment to be installed in the data center and to determine placement locations of the additional equipment in the data center based at least in part on the cooling capacity data of at least one of the plurality of equipment enclosures.

50. A system for managing a data center, the system comprising:
at least one input to receive data related to equipment and equipment enclosures and to receive data related to cooling characteristics of the data center; and
means, coupled to the at least one input, for determining remaining cooling capacity for each of the number of equipment enclosures based on local airflow characteristics of a proposed location for each of the number of equipment enclosures and providing, in a display of the system, an amount of remaining cooling capacity.

51. The system of claim 50, further comprising means for providing an indication of additional power that can be drawn by each of the equipment enclosures.

52. The system of claim 50, further comprising means for updating the amount of remaining cooling capacity based on measured airflows in the data center.

53. The system of claim 50, further comprising means for determining placement of equipment in the data center based on remaining cooling capacity.

54. The system of claim 50, further comprising means for estimating available cooling air of at least one of the equipment enclosures using a weighted summation of available airflows from a plurality of airflow sources.

55. The method of claim 1, wherein determining, by the controller, cooling capacity includes modeling airflows in an area adjacent at least one of the equipment enclosures.

56. A computer readable storage medium having stored thereon sequences of instructions, the sequences of instructions including instructions that when executed by a processor cause the processor to:
determine cooling capacity of a number of equipment enclosures in a data center based on local air flow characteristics of a proposed location for each equipment enclosure in the data center;
determine cooling requirements of each of the number of equipment enclosures; and
provide, in a display of a computer system, an amount of remaining cooling capacity for each of the number of equipment enclosures.

57. A method for modeling cooling in a data center using a computer system, the computer system including a display, a data storage medium and a controller coupled to the display and the data storage medium, the method comprising:
receiving, by the controller, a layout of equipment in the data center, the layout indicating a number of equipment enclosures;
determining, by the controller, cooling capacity for each of the number of equipment enclosures based on local air flow characteristics of a proposed location in the data center for each equipment enclosure;
determining, by the controller, cooling requirements of each of the number of equipment enclosures;
determining, by the controller, an amount of remaining cooling capacity for each of the number of equipment enclosures;
receiving, by the controller, a change in the layout of equipment in the data center; and
providing, by the controller in the display, a change in the amount of remaining cooling capacity of at least one of the number of equipment enclosures based at least in part on the change in the layout of equipment in the data center.

58. The method of claim 57, wherein determining, by the controller, cooling capacity includes modeling airflows in an area adjacent at least one of the equipment enclosures.

59. The method of claim 57, wherein determining, by the controller, cooling capacity includes conducting a Coarse-Grid computational fluid dynamics analysis.

60. The method of claim 57, wherein determining, by the controller, cooling capacity of an equipment enclosure includes estimating available cooling air at the equipment enclosure using a weighted summation of available airflows from a plurality of airflow sources.

61. The method of claim 60, wherein weights used in the weighted summation decrease with distance from the equipment enclosure to each of the airflow sources.

62. The method of claim 60, wherein weights used in the weighted summation are based on mechanical characteristics of the plurality of airflow sources.

63. The method of claim 60, further comprising determining available airflow of at least one of the plurality of airflow devices using at least one of specifications of the at least one of the plurality of airflow devices and measured data for the at least one of the plurality of airflow devices in the data center.

64. The method of claim 63, further comprising determining available airflow of at least a second one of the plurality of airflow devices based on the measured data for the at least one of the plurality of airflow devices.

* * * * *